(12) United States Patent
Fukasawa

(10) Patent No.: US 10,872,798 B2
(45) Date of Patent: Dec. 22, 2020

(54) SUBSTRATE TRANSFER MECHANISM, SUBSTRATE PROCESSING APPARATUS, AND SUBSTRATE TRANSFER METHOD

(71) Applicant: TOKYO ELECTRON LIMITED, Tokyo (JP)

(72) Inventor: Takami Fukasawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/548,652

(22) Filed: Aug. 22, 2019

(65) Prior Publication Data

US 2020/0075376 A1 Mar. 5, 2020

(30) Foreign Application Priority Data

Aug. 31, 2018 (JP) .................................. 2018-163103

(51) Int. Cl.
*H01L 21/677* (2006.01)
*H01L 21/687* (2006.01)

(52) U.S. Cl.
CPC .. *H01L 21/67742* (2013.01); *H01L 21/67745* (2013.01); *H01L 21/67754* (2013.01); *H01L 21/68707* (2013.01)

(58) Field of Classification Search
CPC ......... H01L 21/67742; H01L 21/68707; H01L 21/67745; H01L 21/67754
See application file for complete search history.

(56) References Cited

U.S. PATENT DOCUMENTS

| | | | | |
|---|---|---|---|---|
| 5,151,008 A | * | 9/1992 | Ishida | B25J 9/0084 414/744.5 |
| 5,584,647 A | * | 12/1996 | Uehara | B25J 9/042 414/226.01 |
| 6,102,649 A | * | 8/2000 | Ogawa | B25J 9/1065 414/744.5 |
| 6,155,768 A | * | 12/2000 | Bacchi | H01L 21/67742 414/416.03 |

(Continued)

FOREIGN PATENT DOCUMENTS

| | | |
|---|---|---|
| JP | 2006-294786 A | 10/2006 |
| JP | 2010-157736 A | 7/2010 |

(Continued)

*Primary Examiner* — Kaitlin S Joerger
(74) *Attorney, Agent, or Firm* — Fenwick & West LLP

(57) ABSTRACT

A substrate transfer mechanism includes a moving body, a support body supported by the moving body, first and second rotary shafts at the support body, first and second arms respectively extending from first and second rotary shafts and having first and second substrate support regions. The first arm and the second arm are disposed at different height positions. The mechanism includes a third rotary shaft rotating the support body with respect to the moving body, and a switching mechanism switching a first rotation operation of rotating the support body such that a distance in a right-left direction between the first and second substrate support region is maintained and a second rotation operation of rotating the support body together with rotation of at least one of the first and second rotary shaft such that the distance is changed between a first distance and a second distance shorter than the first distance.

13 Claims, 25 Drawing Sheets

(56) References Cited

U.S. PATENT DOCUMENTS

| | | | |
|---|---|---|---|
| 6,234,738 B1* | 5/2001 | Kimata | H01L 21/68707 414/416.03 |
| 6,360,144 B1* | 3/2002 | Bacchi | B25J 9/042 414/744.3 |
| 6,366,830 B2* | 4/2002 | Bacchi | B25J 9/042 414/217 |
| 7,578,649 B2* | 8/2009 | Caveney | B25J 9/042 414/744.1 |
| 8,376,685 B2* | 2/2013 | Pietrantonio | H01L 21/68707 414/744.5 |
| 8,888,435 B2* | 11/2014 | Yazawa | B25J 9/043 414/744.5 |
| 8,950,998 B2* | 2/2015 | Meulen | B65G 37/00 414/217 |
| 8,961,099 B2* | 2/2015 | Blank | B25J 9/043 414/744.5 |
| 9,033,644 B2* | 5/2015 | Hudgens | B25J 9/0009 414/744.5 |
| 9,190,306 B2* | 11/2015 | Blank | H01L 21/67748 |
| 9,281,222 B2* | 3/2016 | Weaver | H01L 21/67742 |
| 9,457,464 B2* | 10/2016 | Kremerman | H01L 21/67742 |
| 9,875,920 B1* | 1/2018 | Mizuguchi | H01L 21/67745 |
| 10,029,363 B2* | 7/2018 | Kremerman | B25J 9/044 |
| 10,269,613 B2* | 4/2019 | Kato | H01L 21/67766 |
| 10,427,303 B2* | 10/2019 | Weaver | H01L 21/67201 |
| 10,504,763 B2* | 12/2019 | Hofmeister | H01L 21/67742 |
| 10,615,068 B2* | 4/2020 | Coady | H01L 21/68 |
| 10,679,879 B2* | 6/2020 | Kim | H01L 21/67742 |
| 2013/0202398 A1* | 8/2013 | Watanabe | H01L 21/67742 414/744.6 |
| 2014/0348622 A1* | 11/2014 | Yamazoe | H01L 21/67742 414/744.2 |
| 2016/0236345 A1* | 8/2016 | Yoshino | H01L 21/67742 |
| 2017/0125269 A1* | 5/2017 | Dunham | H01L 21/67196 |
| 2018/0108561 A1* | 4/2018 | Hosek | H01L 21/67742 |
| 2018/0229361 A1* | 8/2018 | Hosek | B25J 17/02 |
| 2018/0342409 A1* | 11/2018 | Shindo | H01L 21/67167 |
| 2019/0096702 A1* | 3/2019 | Sakai | H01L 21/67173 |
| 2019/0096726 A1* | 3/2019 | Pietrantonio | B25J 9/042 |
| 2019/0172746 A1* | 6/2019 | Caveney | H01L 21/68707 |
| 2019/0206710 A1* | 7/2019 | Lei | H01J 37/32743 |
| 2019/0270196 A1* | 9/2019 | Muthukamatchi | B25J 9/043 |
| 2019/0287831 A1* | 9/2019 | Mizuguchi | H01L 21/67742 |
| 2019/0355599 A1* | 11/2019 | Shindo | H01L 21/6719 |
| 2019/0355605 A1* | 11/2019 | Hudgens | H01L 21/67742 |
| 2019/0375105 A1* | 12/2019 | Weaver | B25J 9/043 |
| 2019/0385873 A1* | 12/2019 | Yamagishi | H01L 21/6719 |
| 2020/0001453 A1* | 1/2020 | Hofmeister | B25J 11/0095 |
| 2020/0013653 A1* | 1/2020 | Otani | B25J 9/107 |
| 2020/0030968 A1* | 1/2020 | Hosek | H01L 21/67742 |
| 2020/0061805 A1* | 2/2020 | Muthukamatchi | B25J 9/0087 |
| 2020/0075377 A1* | 3/2020 | Wakabayashi | H01L 21/67196 |
| 2020/0122316 A1* | 4/2020 | Tsang | H01L 21/67742 |
| 2020/0161162 A1* | 5/2020 | Yang | H01L 21/67167 |

FOREIGN PATENT DOCUMENTS

| | | |
|---|---|---|
| KR | 10-2008-0039775 A | 5/2008 |
| KR | 10-2014-0044278 A | 4/2014 |

* cited by examiner

SUBSTRATE TRANSFER MECHANISM, SUBSTRATE PROCESSING APPARATUS, AND SUBSTRATE TRANSFER METHOD

CROSS-REFERENCE TO RELATED APPLICATIONS

This application claims priority to Japanese Patent Application No. 2018-163103, filed on Aug. 31, 2018, the entire contents of which are incorporated herein by reference.

TECHNICAL FIELD

The present disclosure relates to a technique for transferring a substrate.

BACKGROUND

As an apparatus for performing surface processing with a high throughput in a semiconductor device manufacturing process, there is known a substrate processing apparatus including a plurality of substrate processing units arranged horizontally in a processing chamber and configured to transfer a semiconductor wafer (hereinafter, referred to as "wafer") as a substrate to each of the substrate processing units and process a plurality of wafers at one time. This substrate processing apparatus includes a substrate mounting unit where a plurality of wafers to be processed is stocked, for example. Substrates are taken out from the substrate mounting unit and transferred to the substrate processing units by a substrate transfer device.

For example, Japanese Patent Application Publication No. 2006-294786 discloses a substrate transfer robot, which is for transferring wafers to and from four stages horizontally arranged in a 2×2 matrix shape and is capable of transferring four wafers horizontally arranged in a 2×2 matrix shape.

In addition, Japanese Patent Application Publication No. 2010-157736 discloses a transfer robot having a plurality of handling arms, each for holding one substrate, and also discloses a technique for collectively transferring a plurality of substrates to a processing module in a state where the substrates are supported by the handling arms spaced apart from each other in a right-left direction.

In view of the above, the present disclosure provides a technique for transferring a plurality of substrates arranged in different layouts to a plurality of modules with a substrate transfer mechanism.

SUMMARY

In accordance with an aspect of the present disclosure, there is provided a substrate transfer mechanism including: a moving body moving horizontally; a support body supported by the moving body; a first rotary shaft and a second rotary shaft provided at the support body while being spaced apart from each other and extended vertically; a first arm extending forward from the first rotary shaft and having a tip portion forming a first substrate support region where one or more substrates are supported at an outer side of the support body; a second arm extending forward from the second rotary shaft and having a tip portion forming a second substrate support region where one or more substrates different from the substrates supported by the first arm are supported at the outer side of the support body, the first arm and the second arm being disposed at different height positions; a third rotary shaft vertically extended and configured to rotate the support body with respect to the moving body; and a switching mechanism configured to switch a first rotation operation of rotating the support body such that a distance in a right-left direction between the first substrate support region and the second substrate support region is maintained and a second rotation operation of rotating the support body together with a rotation of at least one of the first rotary shaft and the second rotary shaft such that the distance in the right-left direction between the first substrate support region and the second substrate support region is changed between a first distance and a second distance shorter than the first distance.

BRIEF DESCRIPTION OF THE DRAWINGS

The objects and features of the present disclosure will become apparent from the following description of embodiments, given in conjunction with the accompanying drawings.

DETAILED DESCRIPTION

Figure 1:
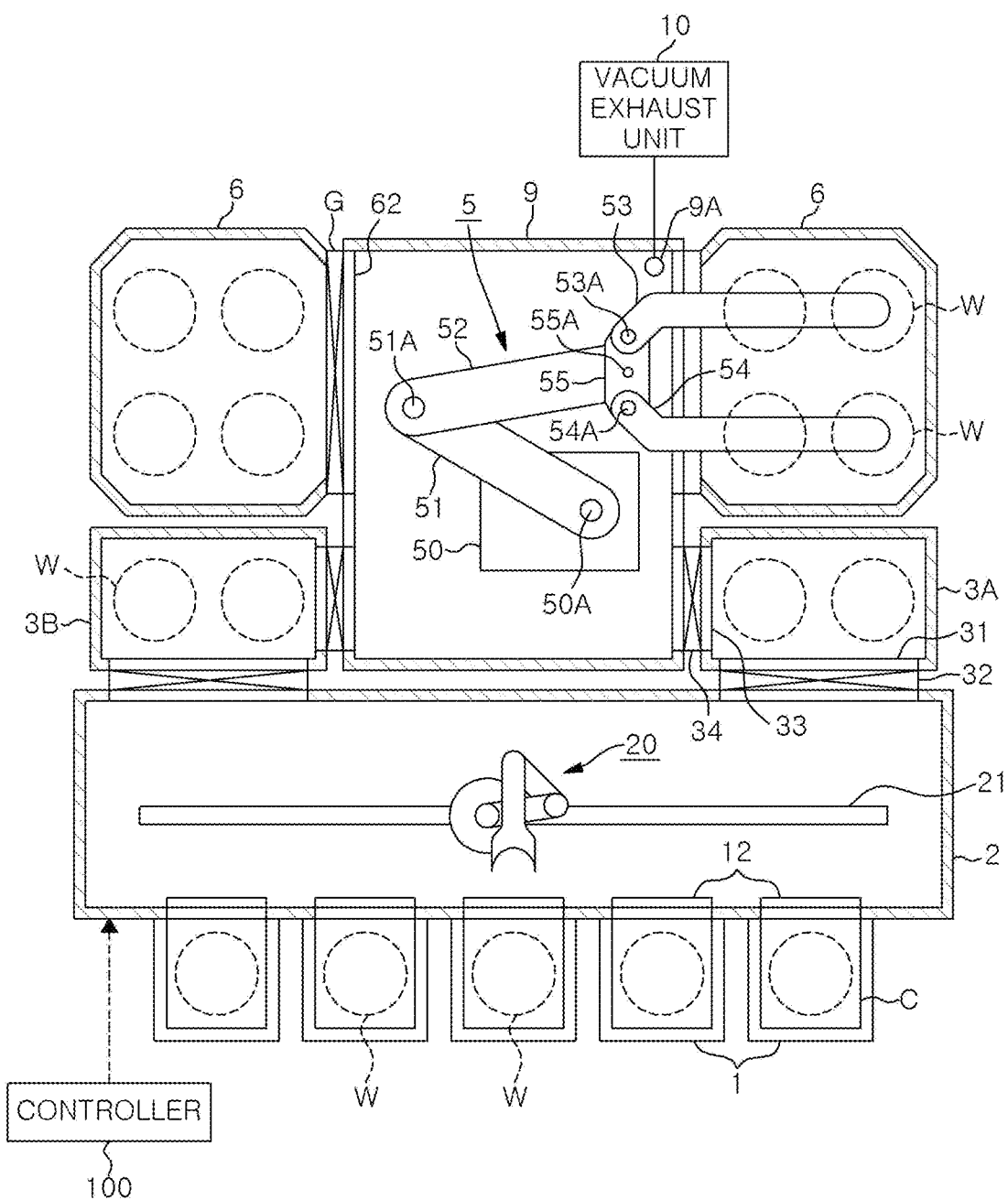
FIG. 1 is a plan view of a vacuum processing apparatus according to an embodiment.
Figure 2:
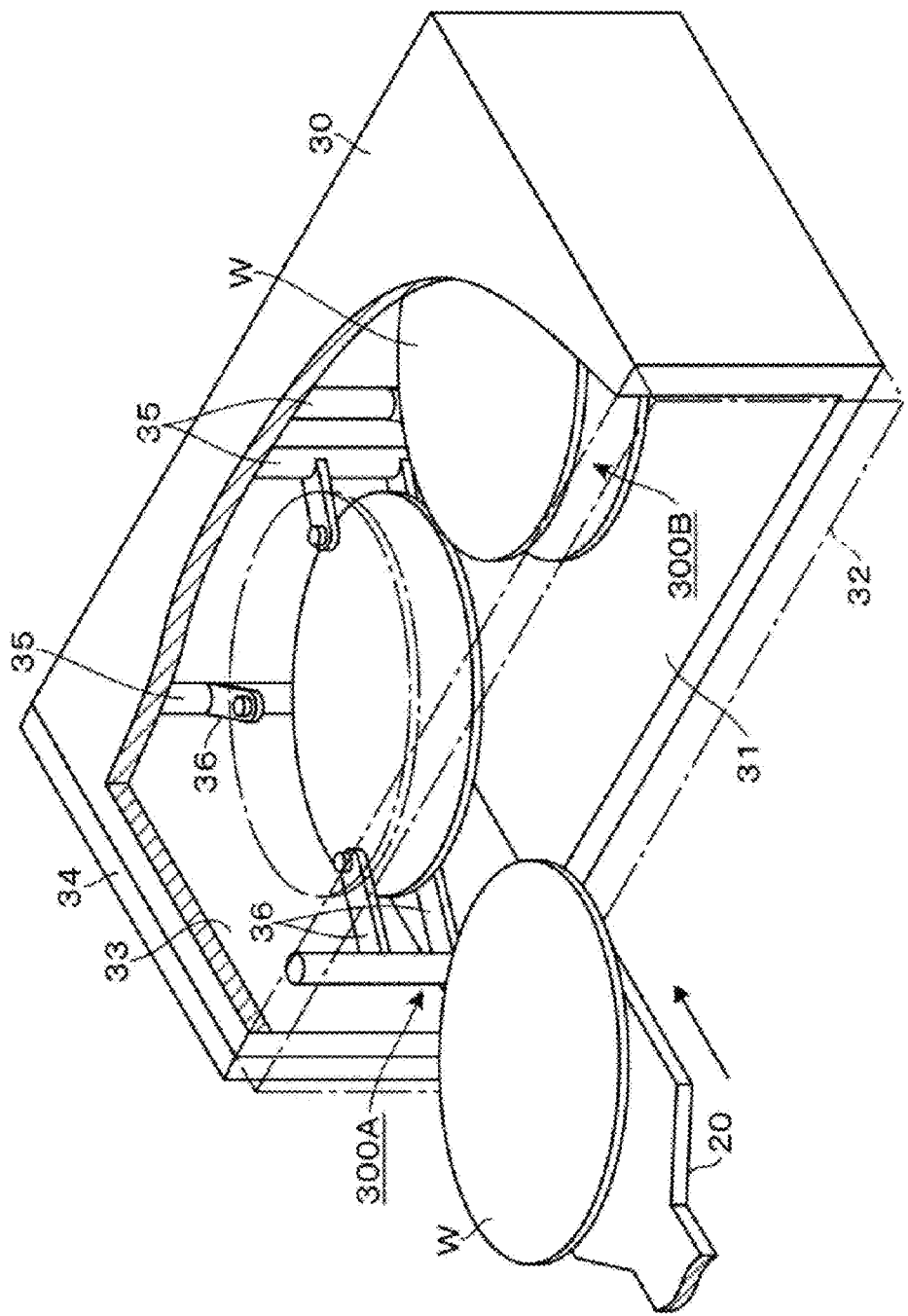
FIG. 2 is a perspective view of a load-lock chamber.

Hereinafter, a vacuum processing apparatus as an example of a substrate processing apparatus according to an embodiment will be described. As shown in FIGS. 1 and 2, the vacuum processing apparatus includes a rectangular normal pressure transfer chamber 2 of which an inner atmosphere is set to a normal pressure atmosphere by dry gas, e.g., dry air or nitrogen gas (an atmospheric atmosphere in the case of air). Five loading/unloading ports 1, each for mounting a carrier C as a transfer container for wafers W, are arranged side by side in a right-left direction of the normal pressure transfer chamber 2. If the loading/unloading port 1 side is set to a front side and the normal pressure transfer chamber 2 side is set to a rear side, a door 12 that is opened and closed together with a lid of the carrier C is attached to a front wall of the normal pressure transfer chamber 2. A normal pressure transfer arm 20 that is a normal pressure transfer mechanism configured as an articulated arm for transferring the wafer W is provided in the normal pressure transfer chamber 2. The normal pressure transfer arm 20 is provided with a moving mechanism (not shown), and is configured to move along a guide rail 21 extending in a longitudinal direction of the normal pressure transfer chamber 2 by the moving mechanism. The normal pressure transfer chamber 2, the normal pressure transfer arm 20, and the loading/unloading port 1 correspond to a loader module.

As shown in FIG. 1, when the normal pressure transfer chamber 2 is viewed from the front side, load-lock chambers 3A and 3B that are load-lock modules are provided near the right side and the left side of the rear wall of the normal pressure transfer chamber 2, respectively. When the rear side is viewed from the loading/unloading port 1, the load-lock chambers 3A and 3B are mirror-symmetrical with respect to a central axis passing through a transversal center of the vacuum transfer chamber 9.

Since the load-lock chambers 3A and 3B are mirror-symmetrical, the right load-lock chamber 3A will be described. As shown in FIGS. 1 and 2, the load-lock chamber 3A includes a rectangular vacuum container 30 extending in the right-left direction of the vacuum processing apparatus. A transfer port 31 is formed on a side surface of the vacuum container 30 that faces the normal pressure transfer chamber 2. A gate valve 32 is provided at the transfer port 31. When the inside of the load-lock chamber 3A is viewed from the transfer port 31 of the load-lock chamber 3A, a transfer port 33 for the wafer W is formed on the left surface of the load-lock chamber 3A. The transfer port 33 is connected to a common vacuum chamber 9 via a gate valve 34 that opens and closes the transfer port 33.

As shown in FIG. 2, wafer mounting shelves 300A and 300B on which wafers W are horizontally mounted are arranged in the load-lock chamber 3A in that order from the front side toward the rear side when viewed from the transfer port 33. Each of the wafer mounting shelves 300A and 300B has three columns 35 and claws 36 extending horizontally from the respective columns 35. The wafer mounting shelves 300A and 300B can support the wafers W horizontally by supporting the peripheral portions of the wafers W with the claws 36.

The claws 36 are arranged at two different height positions of each of the support columns 35. Each of the wafer mounting shelves 300A and 300B can hold the wafers W in two stages. At this time, an upper height position of the wafer mounting shelf 300A at which the wafer W is held is the same as an upper height position of the wafer mounting shelf 300B at which the wafer W is held. A lower height position of the wafer mounting shelf 300A at which the wafer W is held is the same as a lower height position of the wafer mounting shelf 300B at which the wafer W is held.

The support columns 35 are disposed at positions that do not interfere with the wafer W when the wafer W is loaded into the load-lock chamber 3A from the transfer ports 31 and 33. The claws 36 are disposed at positions that do not interfere with the normal pressure transfer arm 20 and a vacuum transfer arm 5 to be described later when the normal pressure transfer arm 20 and the vacuum transfer arm 5 are raised or lowered.

The load-lock chamber 3A is provided with a gas exhaust port (not shown) for exhausting the load-lock chamber 3A to a vacuum atmosphere and a gas supply port (not shown) for supplying an inert gas, e.g., $N_2$ gas, into the load-lock chamber 3A to set an inner atmosphere thereof to an atmospheric atmosphere (normal pressure atmosphere). Accordingly, the atmosphere in the load-lock chamber 3A can be switched between the vacuum atmosphere and the normal pressure atmosphere.

As shown in FIG. 1, the vacuum transfer chamber 9 is formed in a substantially rectangular shape extending from the front side toward the rear side, and a gas exhaust port 9A for setting an inner atmosphere of the vacuum transfer chamber 9 to a vacuum atmosphere is formed at a bottom portion of the vacuum transfer chamber 9. The gas exhaust port 9A is connected to a vacuum exhaust unit 10. When viewed from the loading/unloading port 1, the processing modules 6 are connected to the right side surface and the left side surface of the vacuum transfer chamber 9. As shown in FIG. 1, the vacuum transfer arm 5 that is a substrate transfer mechanism is disposed at a position deviated from the central portion in the vacuum transfer chamber, i.e., towards the right sidewall and near the front side of the vacuum transfer chamber 9 when viewed from the loading/unloading port 1.

Figure 3:
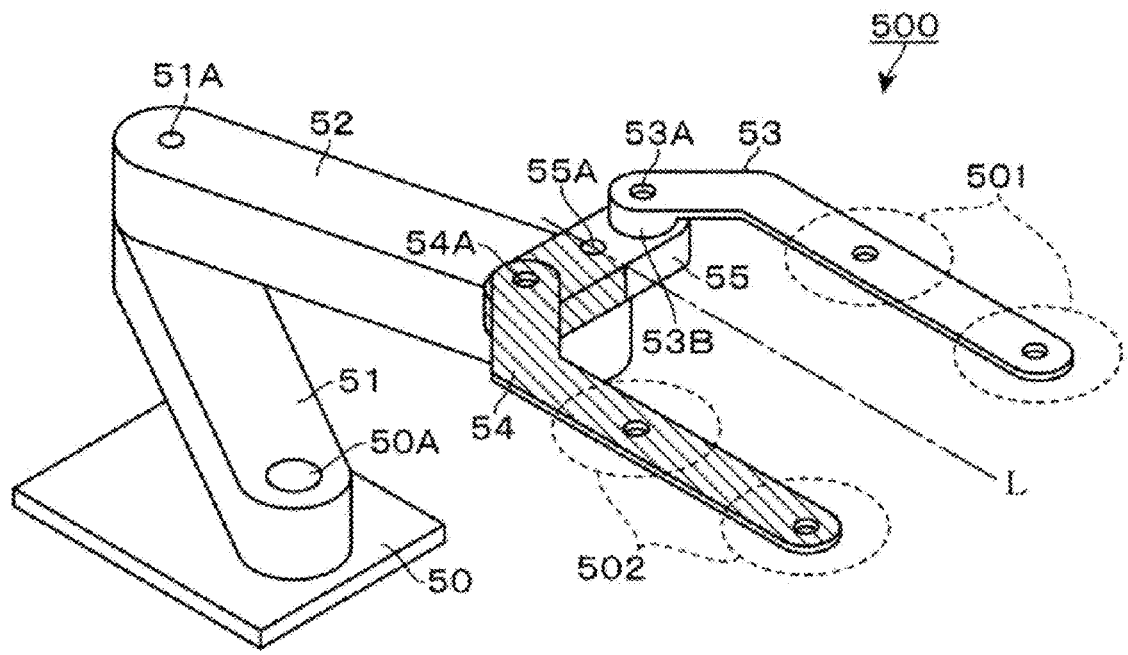
FIG. 3 is a perspective view of a vacuum transfer arm for supporting wafers horizontally.
Figure 4:
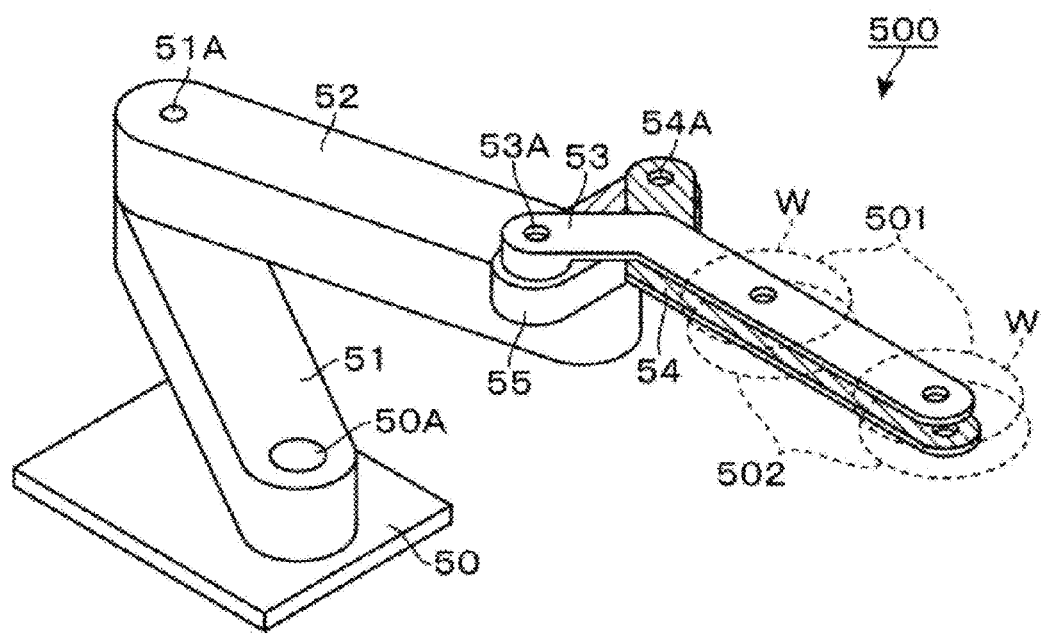
FIG. 4 is a perspective view of a vacuum transfer arm for supporting wafers in a stacked manner.

As shown in FIGS. 3 and 4, the vacuum transfer arm 5 includes a lower arm 51 connected to a base 50 and an upper arm 52 connected to the tip portion of the lower arm 51. The base 50, the lower arm 51, and the upper arm 52 form an articulated arm connected to be rotatable about rotary shafts 50A and 50B extending in a vertical direction. An elevation mechanism (not shown) is provided at the base 50 to raise and lower the lower arm 51 and the upper arm 52. The base 50, the lower arm 51, and the upper arm 52 correspond to a movable body.

A wafer holder 500 for holding wafers W is provided at the tip portion of the upper arm 52. The wafer holder 500 includes a first arm 53, a second arm 54, and a rotating body 55 as a support body for supporting the first arm 53 and the second arm 54. The wafer holder 500 is rotatably connected to the tip portion of the upper arm 52 via a third rotary shaft 55A extending in a vertical direction while passing through the central portion of the rotating body 55.

If a direction in which the tip portion of the first arm 53 extends is set to a forward direction when viewed from the rotating body 55 in FIGS. 3 and 4, the wafer holder 500 can switch between a state in which the first arm 53 and the second arm 54 extend while being spaced from apart from each other in the right-left direction as shown in FIG. 3 and a state in which the first arm 53 and the second arm 54 extend while being aligned vertically as shown in FIG. 4. The configuration of the wafer holder will be described based on the state shown in FIG. 3.

As shown in FIG. 3, the rotating body 55 extends in the right-left direction when viewed from the above. The first arm 53 is connected to a position near the left end portion on the upper surface of the rotating body 55 via a first rotary shaft 53A extending in the vertical direction. The second arm 54 is connected to a position near the right end portion on the upper surface of the rotating body 55 via a second rotary shaft 54A extending in the vertical direction. In this example, the first rotary shaft 53A and the second rotary shaft 54A are arranged at symmetrical positions with respect to the third rotary shaft 55A.

A pedestal portion 53B is provided on a bottom surface of a base portion of the first arm 53 so that a height position of a bottom surface of the tip portion of the first arm 53 is higher than a height position of an upper surface of the wafer W held by the second arm 54. A distance between the height position of the upper surface of the first arm 53 and the height position of the upper surface of the second arm 54 is set to be the same as a distance between a height position of a wafer W held on the upper side and a height position of a wafer W held on the lower side in each of the wafer mounting shelves 300A and 300B provided in the load-lock chambers 3A and 3B.

Figure 5A:
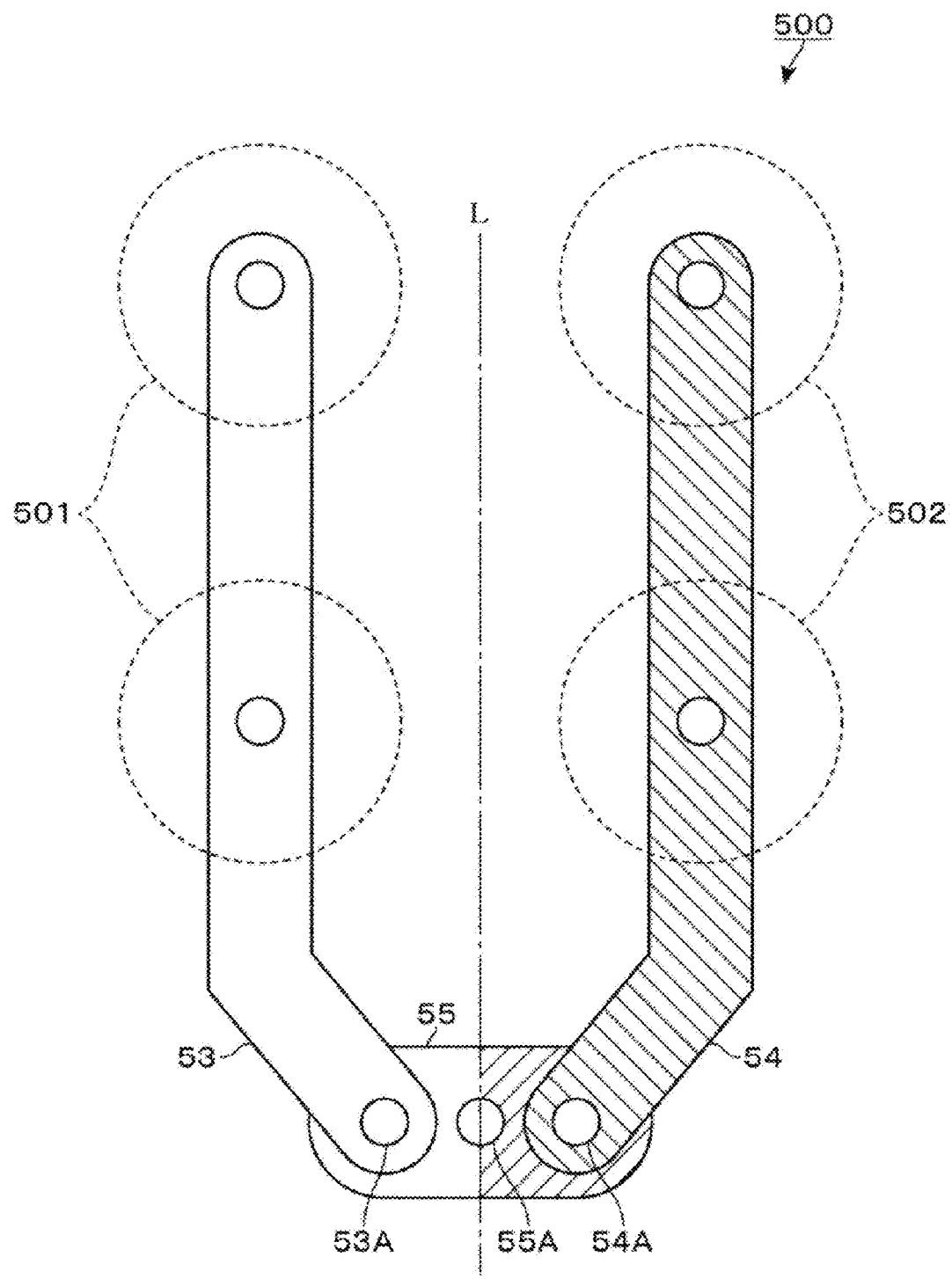
FIGS. 5A to 5D explain a rotation operation of a wafer holder.
Figure 5B:
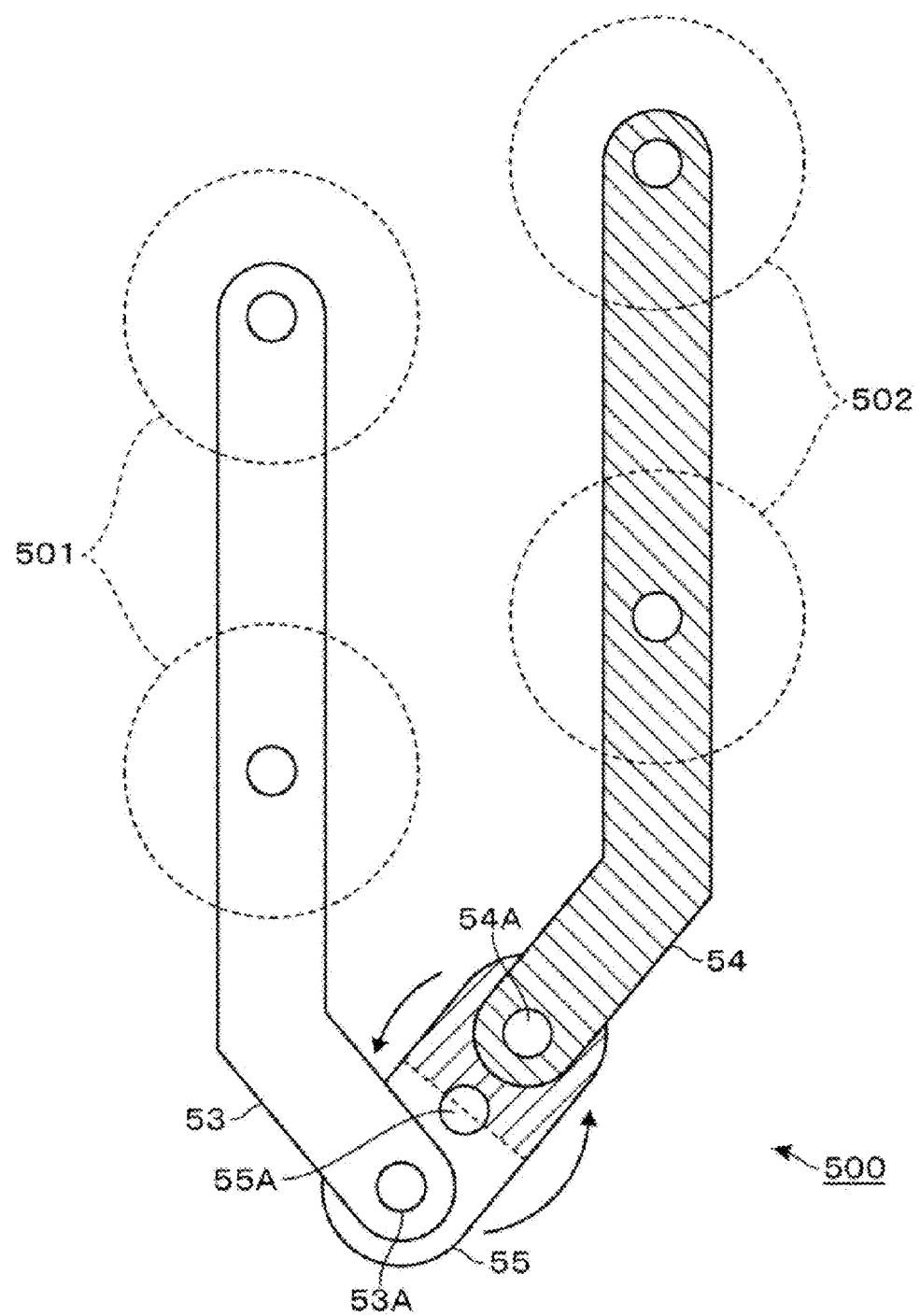
Figure 5C:
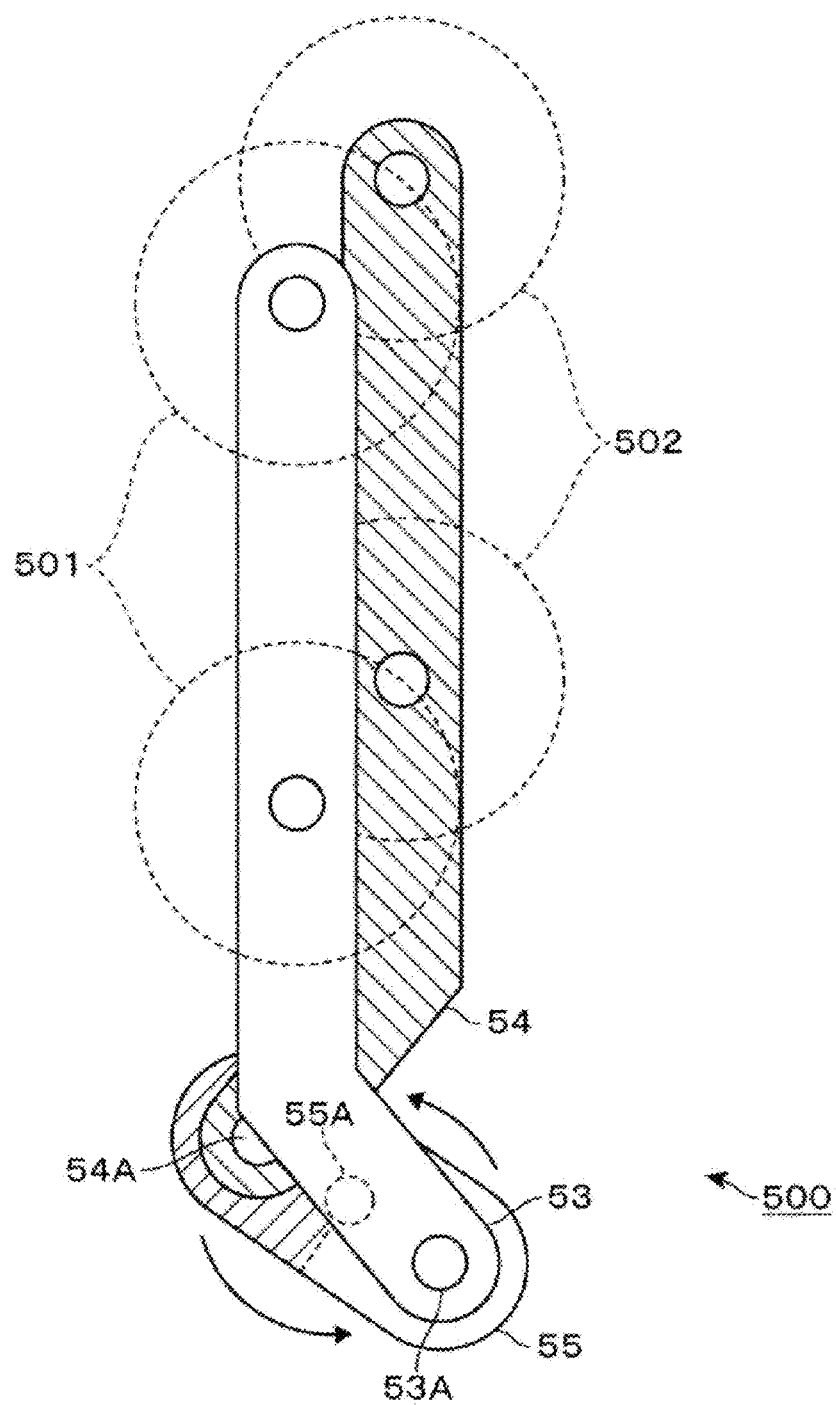

Referring to FIG. 5A, the base portion of the first arm 53 diagonally extends from the first rotary shaft 53A in a left-front direction and the tip portion of the first arm 53 extends forward so that the first arm 53 has a bent shape. When the first arm 53 is viewed forward, the center of the tip portion of the first arm 53 is deviated to the left side from the first rotary shaft 53A by the same distance as the distance between the center of the first rotary shaft 53A and the center of the rotating body 55.

No pedestal portion is provided on the bottom surface of the second arm 54. A base portion of the second arm 54 diagonally extends from the second rotary shaft 54A in a right-front direction and a tip portion of the second arm 54 extends forward so that the second arm 54 has a bent shape. When the second arm 54 is viewed forward, the center of the tip portion of the second arm 54 is deviated to the right side from the second rotary shaft 54A by the same distance as the distance between the center of the first rotary shaft 53A and the center of the rotating body 55. When viewed from above, the first arm 53 and the second arm 54 are mirror-symmetrical with respect to an axis L extending in a back-and-forth direction while passing through the third rotary shaft 55A.

A first substrate support region 501 for supporting two wafers W in a longitudinal direction of the first arm 53 at an outer side of the rotating body 55 is formed at the tip portion of the first arm 53 and extends in a back-and-forth direction. A second substrate support region 502 for supporting two wafers W in the longitudinal direction of the second arm 54 at the outer side of the rotating body 55 is formed at the tip portion of the second arm 54 and extends in a back-and-forth direction.

In the state shown in FIG. 3, support regions of the two wafers W in the first substrate support region 501 and support regions of the two wafers W in the second substrate support region 502 are mirror-symmetrical with respect to the axis L.

The above-described state shown in FIG. 3 is obtained when the first arm 53 and the second arm 54 transfer the wafers W to a processing module 6 to be described later. The state shown in FIG. 4 is obtained when the first arm 53 and the second arm 54 transfer the wafers W to the load-lock chambers 3A and 3B.

FIGS. 5A to 5D show changes in the states of the first arm 53 and the second arm 54 between the state shown in FIG. 3 and the state shown in FIG. 4. In the following description, the state shown in FIG. 3 in which the first substrate support region 501 and the second substrate support region 502 are spaced apart from each other in the right-left direction will be referred to as "the state in which the wafers W are supported horizontally," and the state shown in FIG. 4 in which the first substrate support region 501 and the second substrate support region 502 are vertically overlapped with each other will be referred to as "the state in which the wafers W are supported in a stacked manner."

Figure 5D:
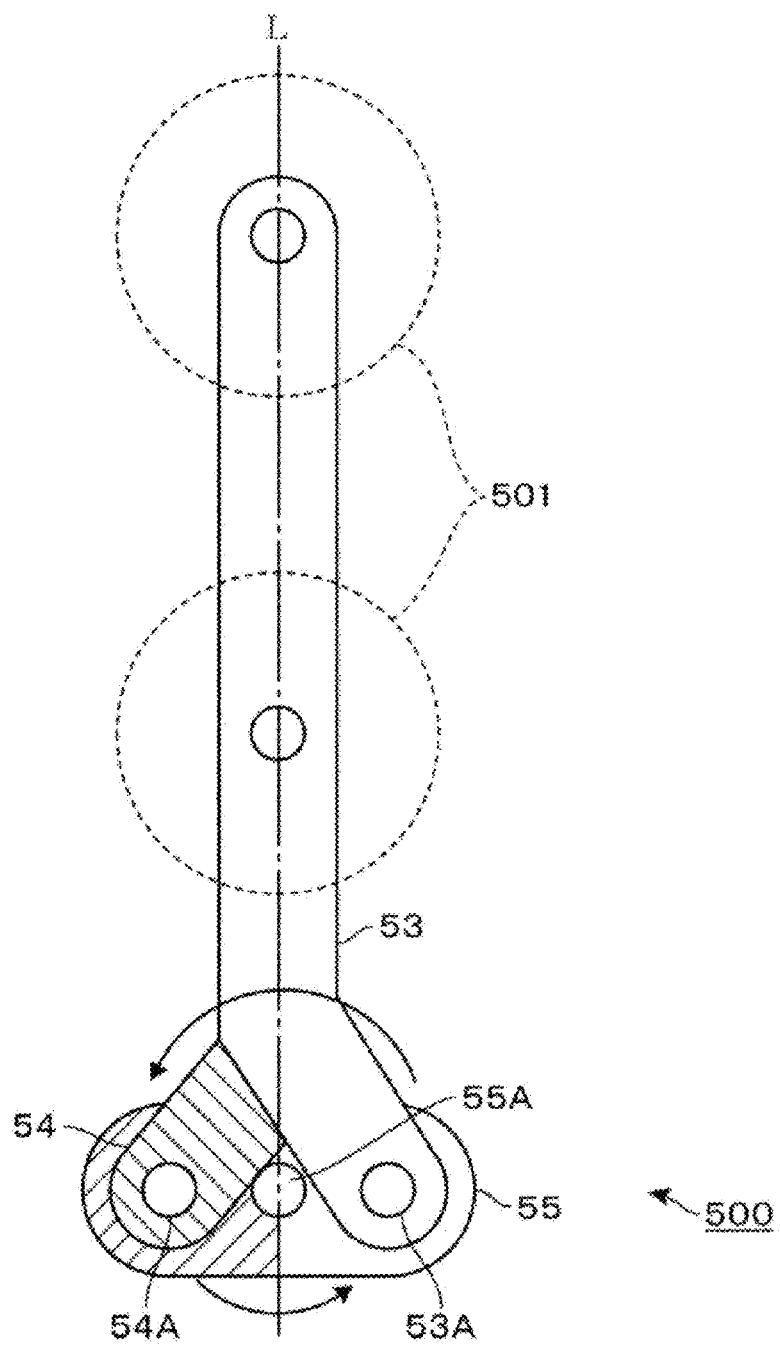

The state shown in FIG. 5A corresponds to the state shown in FIG. 3. The rotating body 55 is rotated from that state in a counterclockwise direction when viewed from above. At this time, the first arm 53 and the second arm 54 rotate in a clockwise direction in response to the rotation of the rotating body 55 when viewed from above. By rotating the first arm 53 and the second arm 54 in response to the rotation of the rotating body 55, the directions of the tip portions of the first arm 53 and the second arm 54 are maintained, which makes the tip portions of the first arm 53 and the second arm 54 remain in parallel with each other. By rotating the first arm 53, the second arm 54 and the rotating body 55, the tip portions of the first arm 53 and the second arm 54 become closer as can be seen from FIG. 5A to FIG. 5B. Further, by rotating the first arm 53, the second arm 54, and the rotating body 55, the second arm 54 is positioned below the first arm 53. Then, when the rotating body 55 is rotated by 180° from the state shown in FIG. 5A, the first substrate mounting region 501 formed at the first arm 53 and the second substrate mounting region 502 formed at the second arm 54 are aligned and overlapped on the axis L when viewed from above, as can be seen in FIG. 5D. Accordingly, the state in which the wafers W are supported horizontally can be switched to the state in which the wafers W are supported in a stacked manner.

By performing the operations shown in FIGS. 5A to 5D in the reverse order, i.e., in the order of the operations shown in FIGS. 5D, 5C, 5B, and 5A, the state in which the wafers W are supported in a stacked manner is switched to the state in which the wafers W are supported horizontally.

Figure 6:
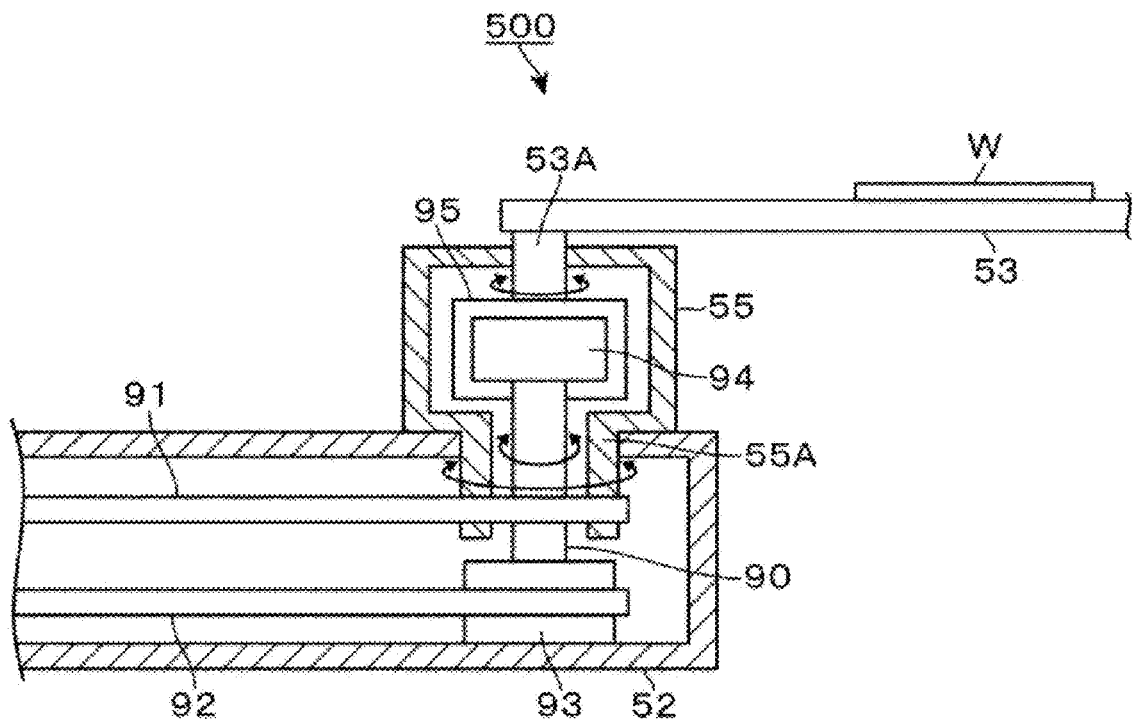
FIG. 6 is a side cross-sectional view of the wafer holder.
Figure 7:
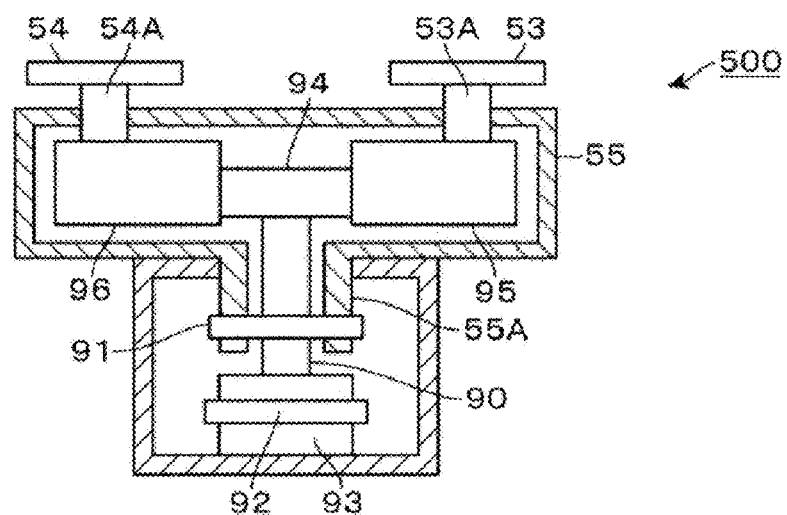
FIG. 7 is a longitudinal cross-sectional front view of the wafer holder.

As described above, the wafer holder 500 can rotate the rotating body 55, the first arm 53, and the second arm 54 individually. FIGS. 6 and 7 show an example of such a driving mechanism. FIG. 6 is a side cross-sectional view of the wafer holder 500. FIG. 7 is a longitudinal cross-sectional front view of the wafer holder 500. As shown in FIGS. 6 and 7, a belt 91 to be driven by a motor (not shown) provided at the base 50 side is provided in the upper arm 52. The belt 91 is configured to rotate the third rotary shaft 55A about the vertical axis. By rotating the third rotary shaft 55A, the rotating body 55 rotates independently from the upper arm 52.

A pulley 93 is provided at an tip portion of an inside of the upper arm 52. The pulley 93 is connected to a lower end of an arm rotary shaft 90 extending upward while penetrating through the third rotary shaft 55A. Further, a belt 92 is connected to the pulley 63. A small gap exists between the third rotary shaft 55A and the arm rotary shaft 90. The third rotary shaft 55A and the arm rotary shaft 90 can rotate without interfering with each other. The upper end of the arm rotary shaft 90 is connected to a gear 94 provided in the rotating body 55. When the gear 94 rotates, a gear in a first gear box 95 rotates and, then, the first arm 53 rotates via the first rotary shaft 53A. Further, when the gear 94 rotates, a gear in a second gear box 96 rotates and, then, the second arm 54 rotates via the second rotary shaft 54A. With this configuration, the first arm 53, the second arm 54, and the rotating body 55 can rotate individually.

When both of the belts 91 and 92 are rotated, e.g., when the belts 91 and 92 are rotated in the same direction at the same time, the first arm 53 and the second arm 54 are rotated in response to the rotation of the rotating body 55 in the same direction as the rotation direction of the rotating body 55. By rotating the first arm 53 and the second arm 54 in response to the rotation of the rotating body 55, the relative positions of the first arm 53 and the second arm 54 with respect to the rotating body 55 are not changed. By rotating the rotating body 55 without relatively rotating the first arm 53 and the second arm 54 with respect to the rotating body 55, it is possible to perform a first rotation operation of rotating the rotating body 55 while maintaining the distance between the first arm 53 and the second arm 54.

By rotating only the belt 91 between the two belts 91 and 92, only the rotating body 55 can be rotated without changing the direction in which the tip portions of the first arm 53 and the second arm 54 extend. At this time, since the first arm 53 and the second arm 54 are rotated relatively with respect to the rotating body 55, the distance between the first arm 53 and the second arm 54 can be changed as shown in FIGS. 5A to 5D, and a second rotation operation of switching the state shown in FIG. 3 in which the wafers W are supported horizontally to the state shown in FIG. 4 in which the wafers W are supported in a stacked manner can be performed.

Hereinafter, the processing module 6 will be described with reference to the longitudinal cross-sectional side view of FIG. 8. The two processing modules 6 are film forming modules for forming a film on a wafer W by plasma atomic layer deposition (ALD). The two processing modules 6 have the same configuration and can simultaneously process the wafers W in the processing modules 6. The processing module 6 includes a vacuum container (processing container) 61 having a rectangular shape when viewed from above (see FIG. 1), and a transfer port 62 for the wafer W that is opened and closed by a gate valve G is formed on the sidewall of the vacuum container 61. A reference numeral 63 in FIG. 8 denotes a gas exhaust port that is opened on the bottom surface of the vacuum container 61. The gas exhaust port 63 is connected to a vacuum pump 65 through a gas exhaust line 64. A reference numeral 66 in FIG. 8 denotes a pressure controller disposed in the gas exhaust line 64. The pressure controller 66 controls the amount of gas exhausted from the gas exhaust port 63 using the vacuum pump 65 to set an inner atmosphere of the vacuum container 61 to a vacuum atmosphere of a desired pressure.

Mounting tables 67A and 67B for mounting thereon the wafers W are arranged in the vacuum container 61 in that order from the front side toward the rear side when viewed from the transfer port 62. The mounting tables 67A and 67B are arranged side by side in the right-left direction when viewed from the transfer port 62. Four wafers W are mounted in a 2×2 matrix shape in the vacuum container 61 when viewed from above. The mounting tables 67A and 67B have the same configuration and formed horizontally in a circular shape. As shown in FIG. 9, the mounting tables 67A and 67B arranged on the left side when viewed from the transfer port 62 are disposed at positions corresponding to the first substrate support region 501 close to the base portion of the first arm 53 and the first substrate support region 501 close to the tip portion of the first arm 53 in the wafer holder 500 for holding the wafer W horizontally. Further, the mounting tables 67A and 67B arranged on the right side when viewed from the transfer port 62 are disposed at positions corresponding to the second substrate support region 502 close to the base portion of the second arm 54 and the second substrate support region 502 close to the tip portion of the second arm 54 in the wafer holder 500 for holding the wafer W horizontally. A reference numeral 70 in FIG. 8 denotes a heater embedded in each of the mounting tables 67A and 67B. The heaters 70 heat the wafers W mounted on the mounting tables 67A and 67B in a range from 300° C. to 450° C. A reference numeral 68 in FIG. 8 denotes a support column penetrating through a central portion of the bottom surface of the vacuum container 61. Four support arms 69 extend radially from the upper end of the support column 68 in a horizontal direction and support the mounting tables 67A and 67B from the bottom sides thereof. The lower end of the support column 68 is connected to an elevation mechanism 71 outside the bottom portion of the vacuum container 61. The mounting tables 67A and 67B are raised and lowered by the elevation mechanism 71 via the support column 68 and the support arms 69 between a position indicated by a solid line and a position indicated by a dotted line in FIG. 8. The position indicated by the solid line corresponds to a processing position at which the wafers W are processed. The position indicated by the dotted line corresponds to a transfer position at which the wafers W are transferred between the mounting tables 67A and 67B and the vacuum transfer arm 5. A reference numeral 72 in FIG. 8 denotes a seal member for maintaining the vacuum container 61 in an airtight state.

Figure 8:
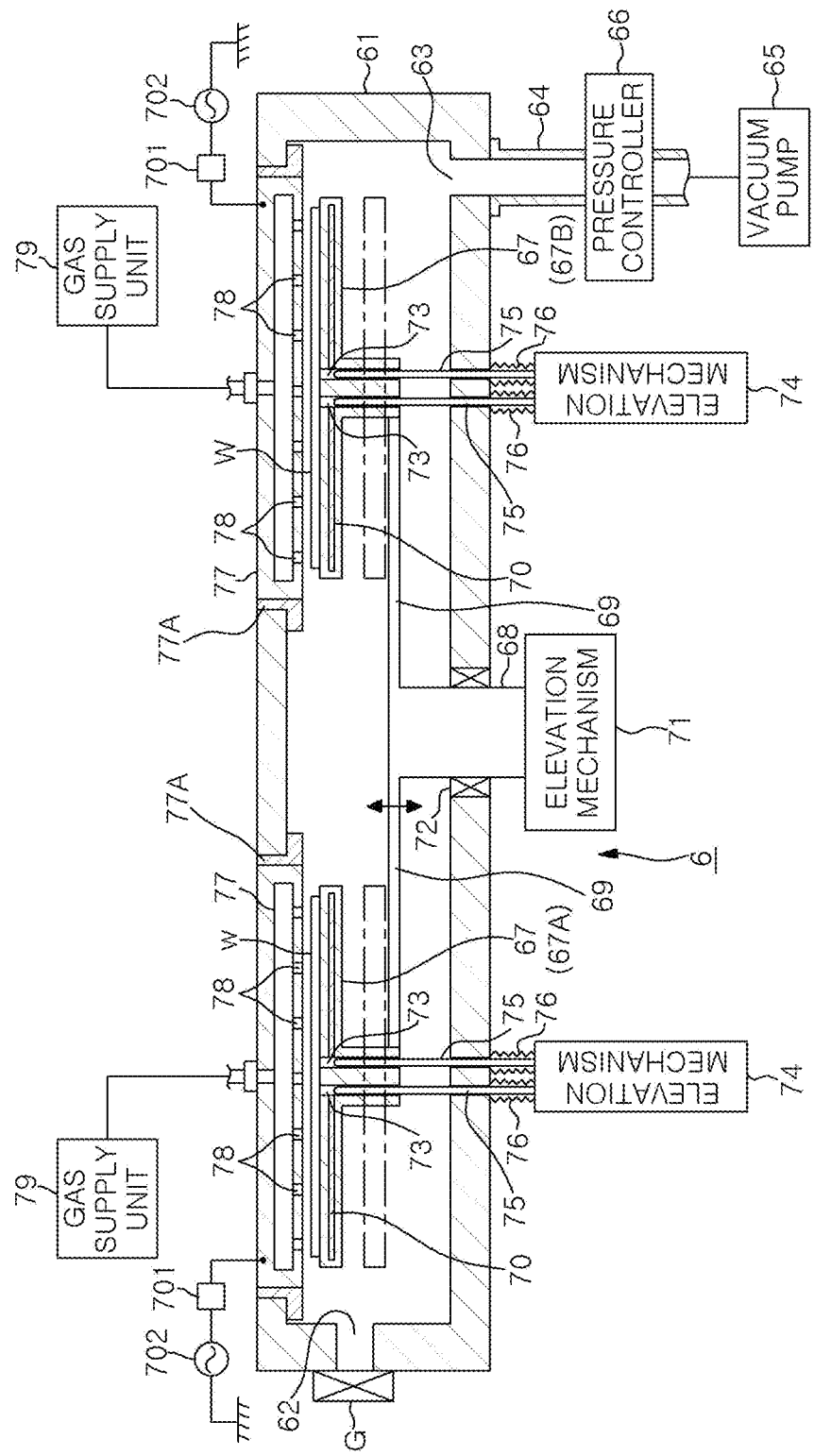
FIG. 8 is a cross-sectional view of processing modules.
Figure 9:
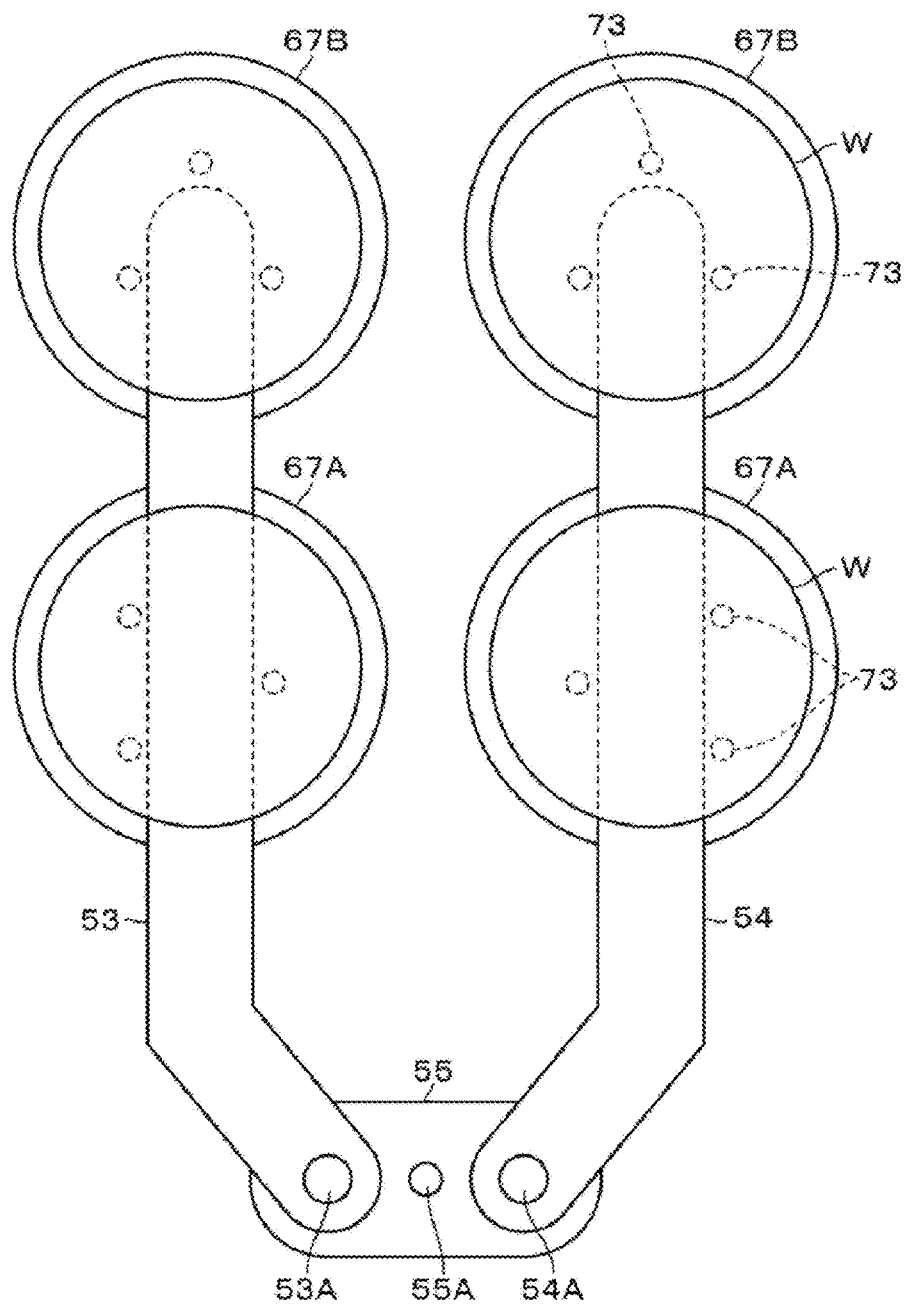
FIG. 9 is a plan view showing transfer of wafers between the wafer holder and mounting tables.

As shown in FIGS. 8 and 9, three through-holes 73 (only two are shown in FIG. 8) are formed in each of the mounting tables 67A and 67B without being interfered with the first arm 53 and the second arm 54. Lift pins 75 are inserted into the through-holes 73 to transfer the wafer W with the vacuum transfer arm 5. A reference numeral 74 in FIG. 8 denotes an elevation mechanism 74 for raising and lowering the lift pins 75. The elevation mechanism 74 is disposed outside the bottom portion of the vacuum container 61. A reference numeral 76 in FIG. 8 denotes a bellows for securing airtightness in the vacuum chamber 61.

At the ceiling of the vacuum container 61, gas shower heads 77 are provided above the mounting tables 67A and 67B via insulating members 77A. The bottom surfaces of the gas shower heads 77 face the mounting tables 67A and 67B, and a plurality of gas injection holes 78 is distributed on the bottom surfaces of the gas shower heads 77. High frequency power supplies 702 are connected to the gas shower heads 77 via matching units 701. Lower electrodes (not shown) are embedded in the mounting tables 67A and 67B and are connected to the ground potential. A reference numeral 79 in FIG. 8 denotes a gas supply unit. The gas supply unit 79 supplies titanium tetrachloride ($TiCl_4$), hydrogen ($H_2$) gas, argon (Ar) gas, and nitrogen ($N_2$) gas to the gas shower head 77 independently. These gases are injected from the gas injection ports 78.

Hereinafter, a process of forming a film on the wafer W in the processing module 6 will be described. After the wafers W are mounted on the two mounting tables 67A and the two mounting tables 67B at the transfer position, the wafers W are heated by the heaters 70. At the same time, the mounting tables 67A and 67B are raised to the processing positions. Then, $TiCl_4$ gas as a film forming gas is supplied from the gas shower heads 77 and adsorbed onto the surfaces of the wafers W. Further, Ar gas and $H_2$ gas are supplied as reactant gases. The supplied reactant gases are formed into plasma by capacitive coupling by applying a high frequency power from the high frequency power source 702 to a space between the gas shower head 77 and the lower electrodes in the mounting tables 67A and 67B. Thus, the $TiCl_4$ gas and the $H_2$ gas are activated and react with each other, thereby forming a Ti (titanium) layer on the surface of the wafer W.

The adsorption of the $TiCl_4$ gas, the supply of the Ar gas and the $H_2$ gas, and the formation of plasma from the reactant gases are sequentially repeated multiple times. Accordingly, the formation of the Ti layer is repeated. As a result, a Ti film having a desired thickness is formed.

As shown in FIG. 1, the vacuum processing apparatus includes a controller 100 for controlling the transfer of the wafer W in the vacuum processing apparatus, the driving of the switching mechanism of the wafer holder 500 in the vacuum transfer arm 5, the film forming process in the processing module 6, and the switching of the atmosphere in the load-lock chambers 3A and 3B. The controller 100 includes, e.g., a computer including a CPU (not shown) and a storage unit. The storage unit stores a recipe for the film forming process in the processing module 6, or a program including steps (commands) for transferring the wafer W by the normal pressure transfer arm 20 and the vacuum transfer arm 5 in the vacuum processing apparatus. The program is stored in a storage medium, e.g., a hard disk, a compact disk, a magnetic optical disk, a memory card, or the like, and is installed on the computer therefrom.

Figure 10:
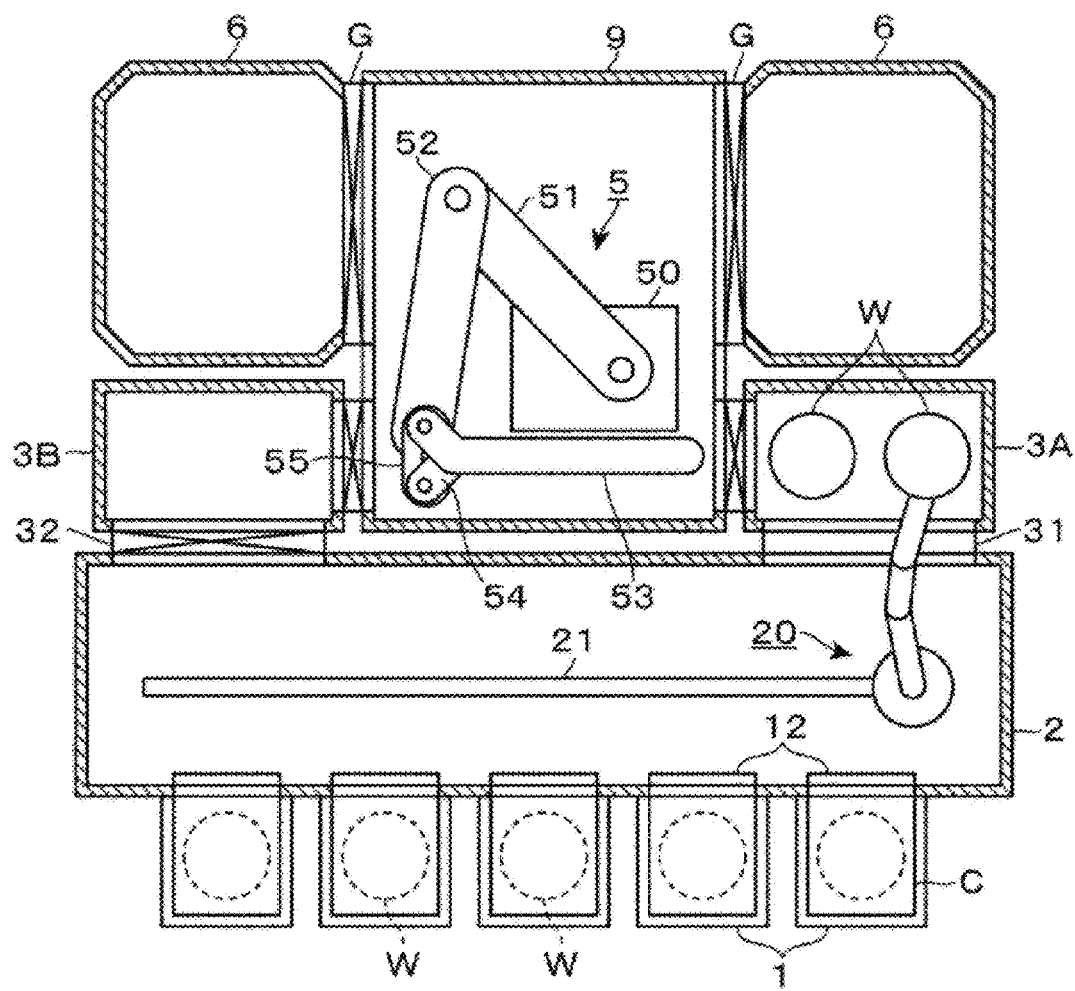
FIGS. 10 and 11 explain an operation of a vacuum transfer device according to an embodiment.

Hereinafter, the operation of the vacuum processing apparatus will be described. As shown in FIG. 10, when the carrier C accommodating the wafers W is mounted on the loading/unloading port 1, the wafers W in the carrier C are taken out and transferred to the wafer mounting shelves 300 of the load-lock chambers 3A and 3B by the normal pressure transfer arm 20. After the wafers W are mounted on the wafer mounting shelves 300 of the load-lock chambers 3A and 3B, the normal pressure transfer arm 20 is retracted to the normal pressure transfer chamber 2. Then, the gate valve 32 is closed, and the atmosphere in the load-lock chambers 3A and 3B is switched to a vacuum atmosphere.

Figure 11:
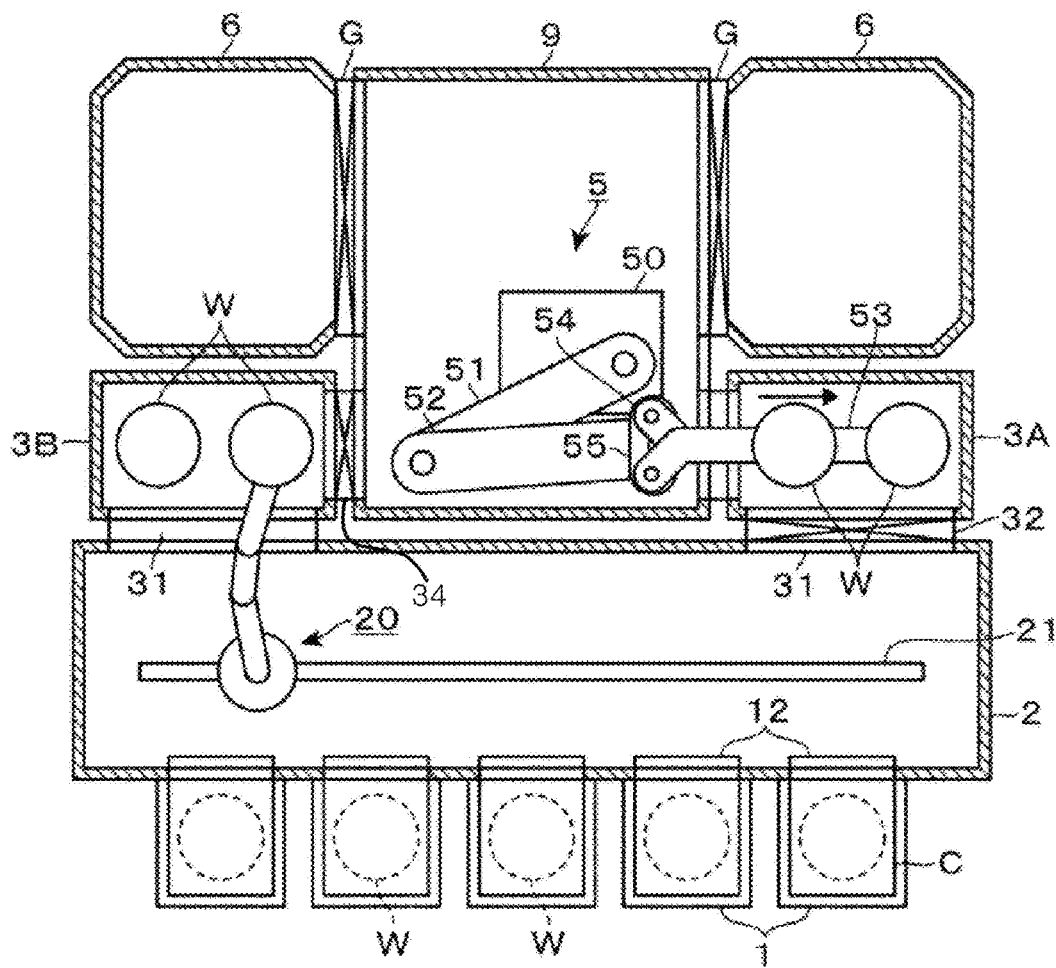
Figure 12:
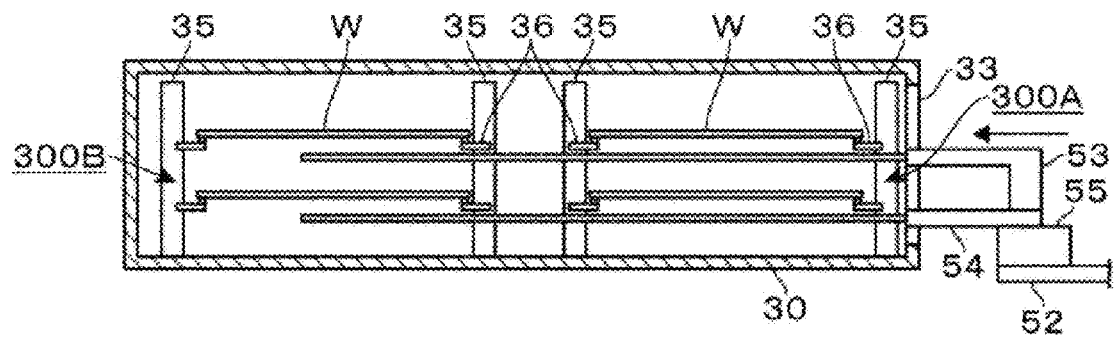
FIGS. 12 and 13 explain transfer of wafers in a load-lock chamber.
Figure 13:
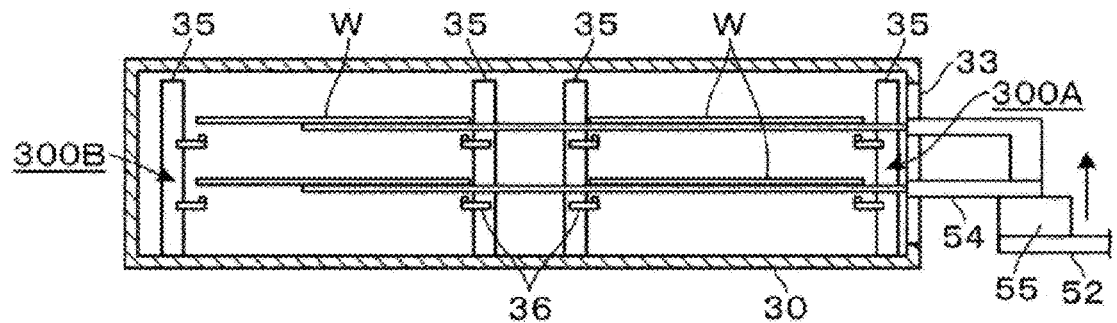

Next, as shown in FIG. 11, for example, the gate valve 34 between the load-lock chamber 3A and the vacuum transfer chamber 9 is opened, and the wafer holder 500 of the vacuum transfer arm 5, for which the state is switched to the state in which the wafers W are supported in a stacked manner, is moved into the load-lock chamber 3A. At this time, as shown in FIG. 12, the second arm 54 is positioned below the lower two wafers W in the load-lock chamber 3A, and the first arm 53 is positioned below the two upper wafers W in the load-lock chamber 3A. Then, when the vacuum transfer arm 5 is raised, the four wafers W in the load-lock chamber 3A are collectively raised by the first and the second arm 53 and 54 as shown in FIG. 13.

Figure 14:
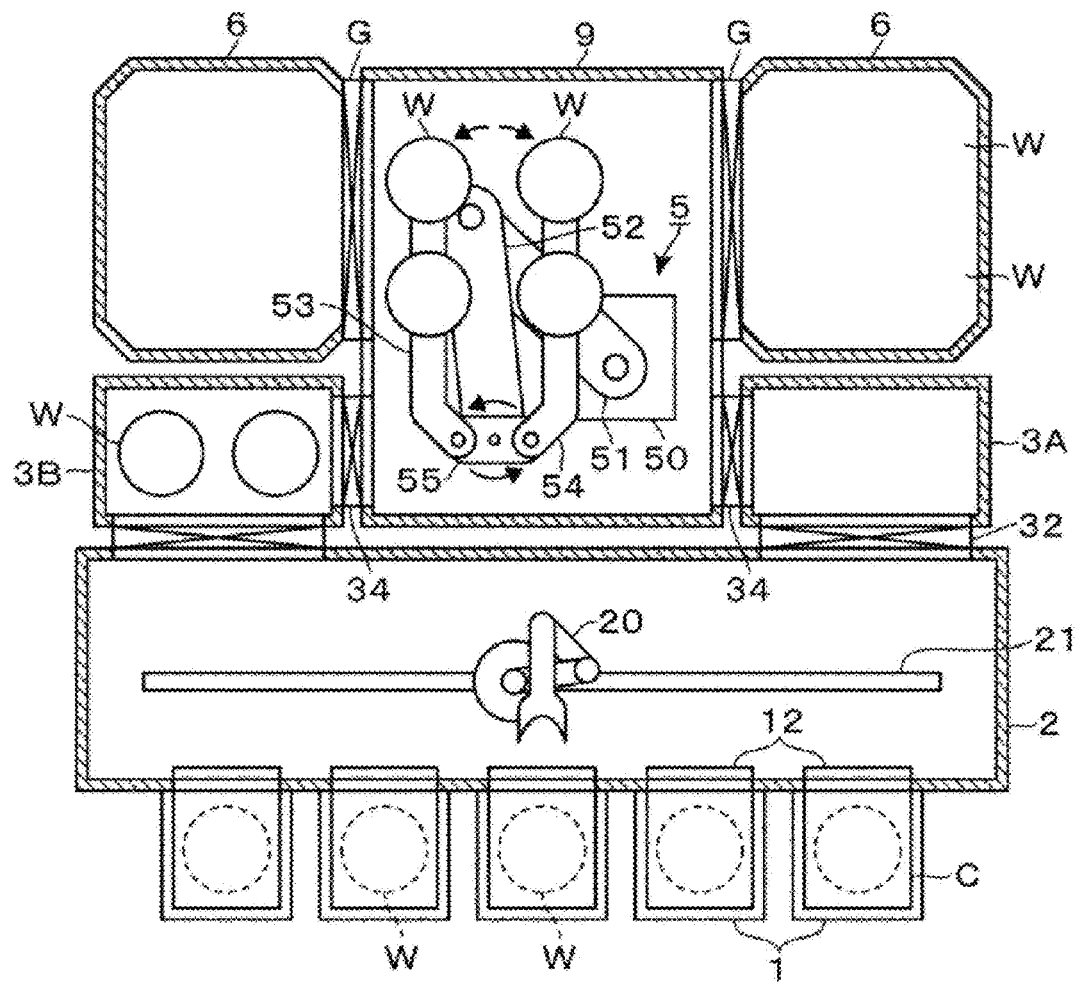
FIGS. 14 to 18 explain the operation of the vacuum transfer device according to the embodiment.

Next, as shown in FIG. 14, the vacuum transfer arm 5 is retracted from the load-lock chamber 3A to the vacuum transfer chamber 9, and the gate valve 34 is closed. Then, the rotating body 55 of the vacuum transfer arm 5 is rotated to switch the state of the wafer holder 500 to the state in which the wafers W are supported horizontally (the second rotation operation is performed).

Figure 15:
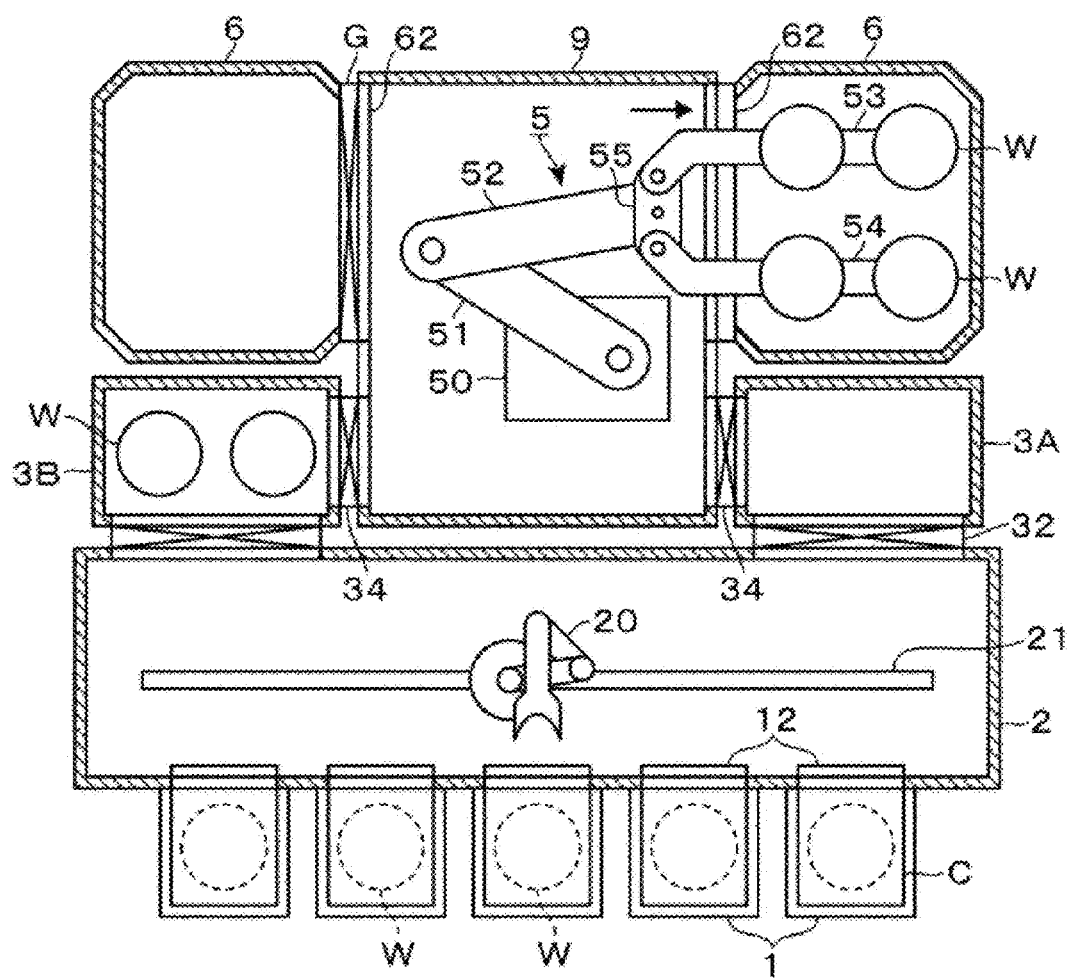

Then, as shown in FIG. 15, for example, the gate valve G of the processing module 6 on the right side of the vacuum transfer chamber 9 when viewed from the front side of the vacuum processing apparatus is opened, and the wafer holder 500 supporting the wafers W horizontally is moved into the processing module 6.

When the wafer holder 500 is moved into the processing module 6, the four wafers W supported by the vacuum transfer arm 5 are positioned above the four mounting tables 67A and 67B of the processing module 6, respectively. Then, the lift pins 75 provided at the mounting tables 67A and 67B are lifted to raise and receive the wafers W supported by the vacuum transfer arm 5. Then, the vacuum transfer arm 5 is retracted to the vacuum transfer chamber 9, and the lift pins 75 are lowered so that the wafers W can be mounted on the mounting tables 67A and 67B. In this manner, the four wafers W are collectively transferred to the corresponding mounting tables 67A and 67B.

Similarly, the wafers W in the load-lock chamber 3B are collectively transferred by the vacuum transport arm 5 to the processing module 6 on the left side of the vacuum transfer chamber 9 when viewed from the front side of the vacuum processing apparatus. Then, the above-described film forming process is performed on the wafer W in each processing module 6.

Figure 16:
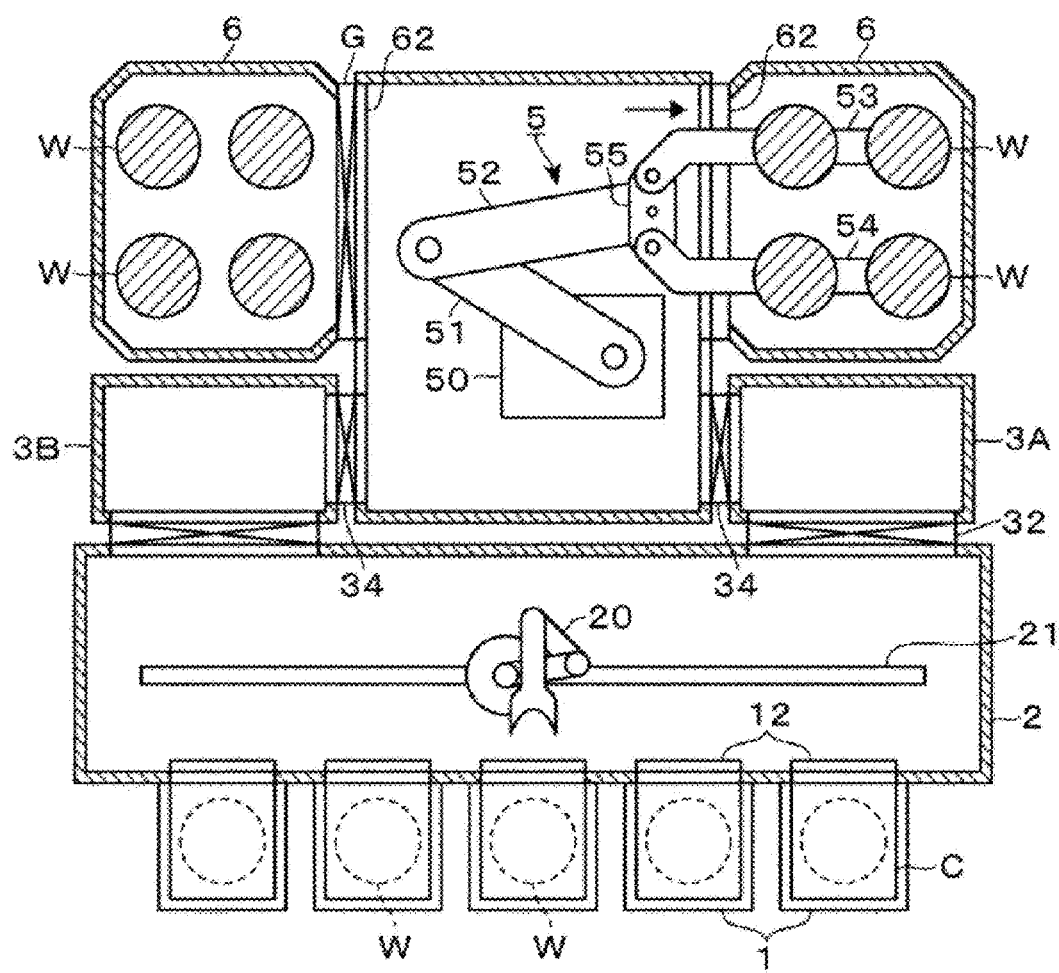
Figure 17:
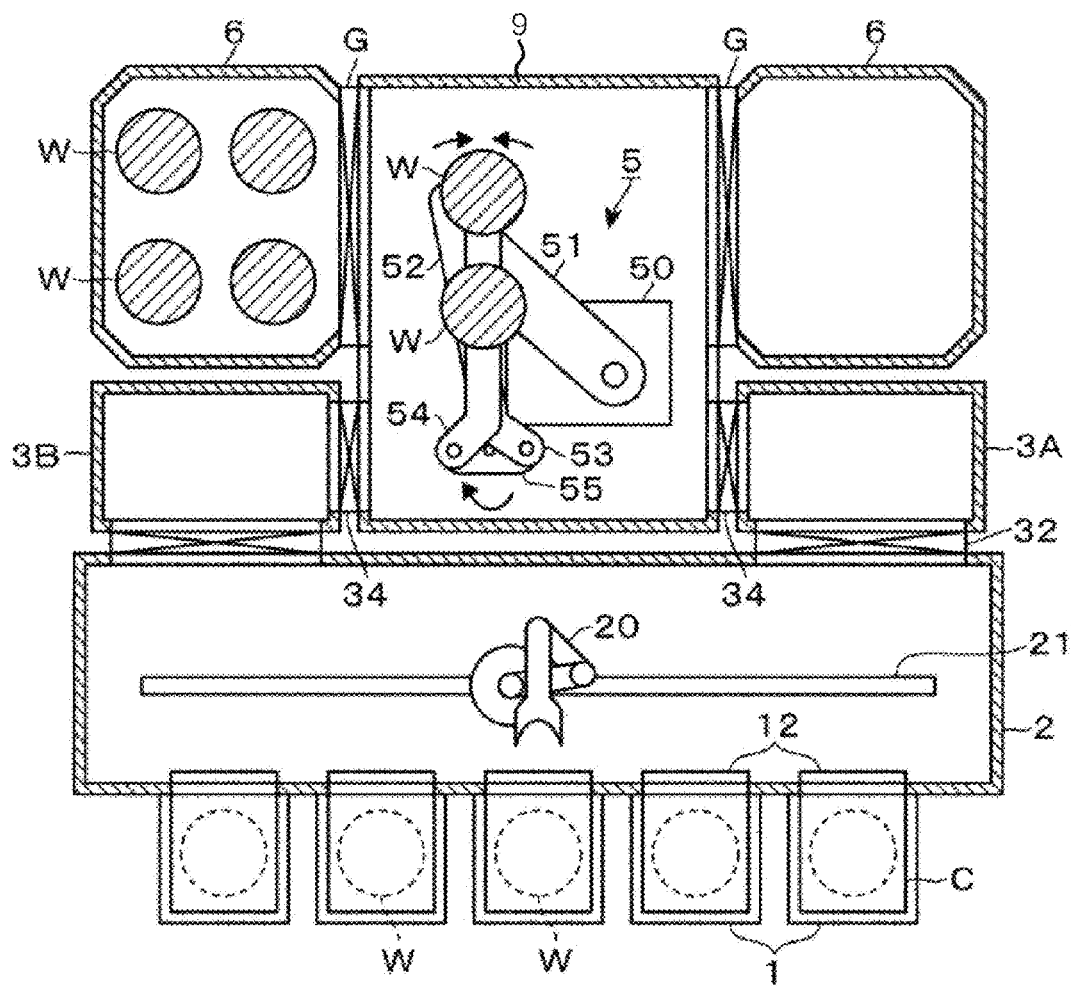
Figure 18:
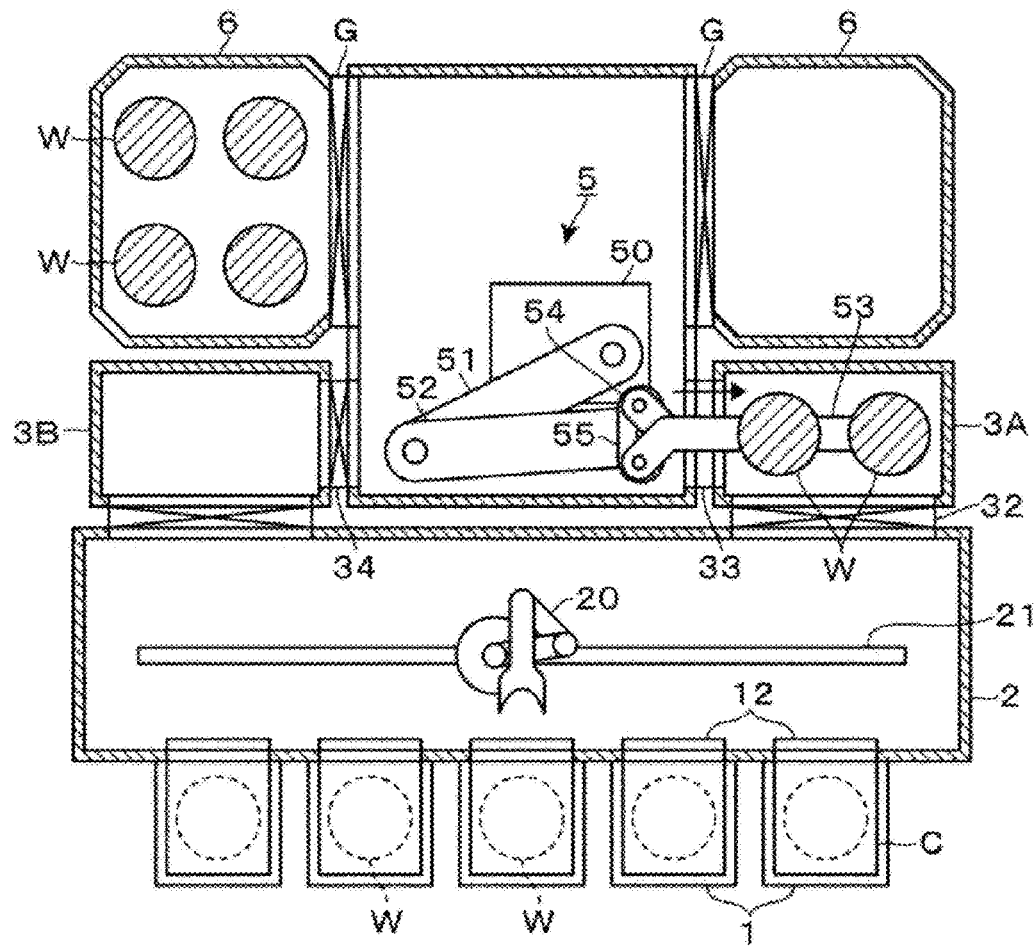

When the film forming process is completed in each processing module 6, the wafers W on the mounting tables 67A and 67B are raised by the lift pins 75, and the gate valve G in the processing module 6 on the right side when viewed from the front side is opened as shown in FIG. 16. Then, the wafer holder 500 holding the wafers W horizontally is moved into the processing module 6. At this time, the first arm 53 and the second arm 54 are positioned below the corresponding wafers W to be aligned with the first substrate support region 501 and the second substrate support region 502. By lowering the lift pins 75, the four wafers W are collectively transferred to the first arm 53 and the second arm 54. In FIGS. 16 to 18, the processed wafers W are indicated by hatching.

Figure 19:
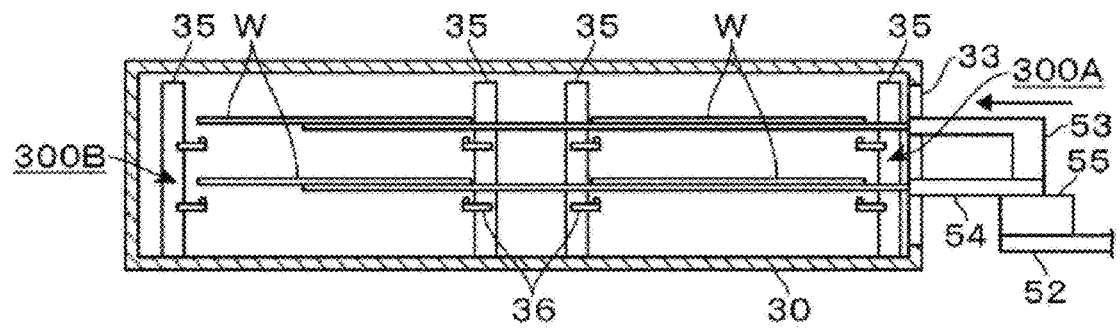
FIGS. 19 and 20 explain transfer of the wafers in the load-lock chamber.
Figure 20:
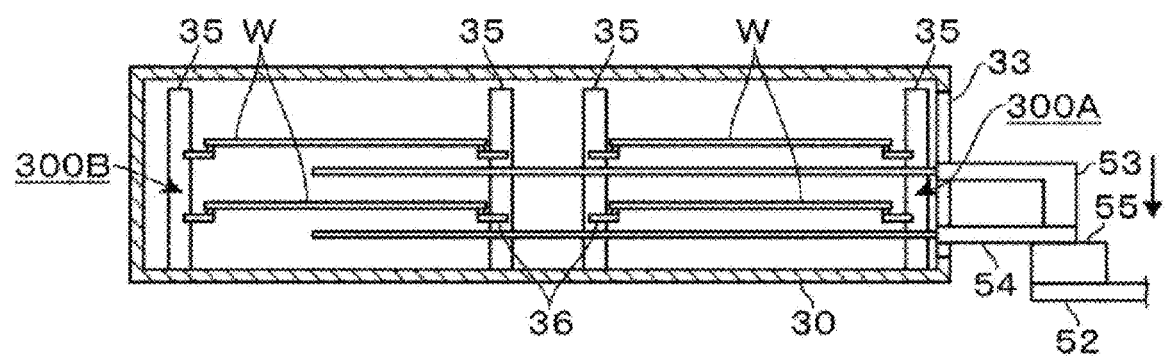

Next, as shown in FIG. 17, the wafer holder 500 is retracted to the vacuum transfer chamber 9, and the state of the wafer holder 500 is switched to the state in which the wafers W are supported in a stacked manner Thereafter, as shown in FIG. 18, the gate valve 34 of the load-lock chamber 3A at the vacuum transfer chamber 9 side is opened, and the vacuum transfer arm 5 is moved into the load-lock chamber 3A while supporting the wafers W in a stacked manner. At this time, as shown in FIG. 19, the wafers W supported at the tip portions of the first arm 53 and the second arm 54 are positioned above the claws 36 for holding the wafers W on the upper side and the lower side of the wafer mounting shelf 300B. Further, the wafers W supported at the base portions of the first arm 53 and the second arm 54 are positioned above the claws 36 for holding the wafers W on the upper side and the lower side of the wafer mounting shelf 300A. By lowering the vacuum transfer arm 5, the wafers W held by the first arm 53 and the second arm 54 are transferred to the wafer mounting shelves 300A and 300B as shown in FIG. 20.

Thereafter, the vacuum transfer arm 5 is retracted to the vacuum transfer chamber 9. The gate valve 34 is closed, and the atmosphere in the load-lock chamber 3A is switched to the normal pressure atmosphere. Then, the gate valve 32 on the normal pressure transfer chamber 2 side is opened, and the four processed wafers W supported by the wafer mounting shelves 300A and 300B are returned to the carrier C by the normal pressure transfer arm 20.

The vacuum transfer arm 5 takes out the processed wafers W from the processing module 6 that is disposed on the left side of the vacuum transfer chamber 9 when viewed from the front side of the vacuum transfer apparatus and transfers the processed wafers W to the load-lock chamber 3B. Thereafter, the processed wafers W are taken out from the load-lock chamber 3B and transferred to the carrier C by the normal pressure transfer arm 20.

As for the vacuum processing apparatus, there is known an apparatus in which a plurality of mounting tables for mounting substrates thereon is horizontally arranged in a processing module to improve the throughput of the apparatus. For example, there is known an apparatus in which four mounting tables 67A and 67B are arranged in a 2×2 matrix shape as in the embodiment and four wafers are processed on the mounting tables 67A and 67B. In this apparatus, in order to further improve the throughput of the apparatus, a vacuum transfer mechanism for transferring substrates to the processing module is configured to horizontally support four substrates arranged in a 2×2 matrix shape and collectively transfer the four substrates.

However, in the conventional vacuum transfer mechanism for supporting four substrates horizontally, it is required to horizontally arrange four substrates in a 2×2 matrix shape in a module for transferring substrates to be loaded into the processing module to the vacuum transfer mechanism, e.g., in the load-lock module connected to the vacuum transfer chamber 9 where the vacuum transfer mechanism is provided, and also required to collectively transfer the substrates to the vacuum transfer mechanism. Therefore, a region for mounting four substrates horizontally is required in the load-lock module, which leads to an increase in an installation area of the apparatus.

The increase in the installation area of the apparatus can be avoided by reducing the number of substrates arranged horizontally in the load-lock module, e.g., by stacking the substrates in 2 sheets×2 stages (i.e., by stacking two substrates in each of 2 stages). In this case, however, the vacuum transfer device configured to support two substrates horizontally needs to access two substrates twice in order to transfer the substrates to the processing module where the mounting tables are arranged in a 2×2 matrix shape. Further, the throughput may be reduced because a step is required to receive the substrates stacked in two stages by employing a mechanism for stacking and holding substrates in 2 sheets×2 stages as the vacuum transfer mechanism, and a step is required to re-arrange the stacked substrates to be horizontally supported by employing a transfer mechanism provided in the processing module to re-arrange the stacked substrates to the horizontal state.

In addition, since the transfer mechanism is provided in the processing module, particles may be generated.

In accordance with the above-described embodiment, in the vacuum transfer arm 5, the first rotary shaft 53A and the second rotary shaft 54A extending in the vertical direction are provided at the rotating body 55 while being spaced apart from each other. Further, the first arm 53 diagonally extends from the first rotary shaft 53A in the left-front direction, and the tip portion thereof is bent forward. The second arm 54 diagonally extends from the second rotary shaft 54A in the right-front direction, and the tip portion thereof is bent forward. The first arm 53 and the second arm 54 are disposed at different height positions.

The substrate support region 501 and the second substrate support region 502 are provided at the tip portion of the first arm 53 and the tip portion of the second arm 54 to hold two different wafers W in the longitudinal direction of the first arm 53 and the second arm 54, respectively. In addition, the third rotary shaft 55A is provided at the rotating body 55, and it is possible to switch the second rotation operation of rotating the rotating body 55 while changing the distance in the right-left direction between the first substrate support region 501 and the second substrate support region 502 and the first rotation operation of rotating the rotating body 55 without changing the distance between the first substrate support region 501 and the second substrate support region 502.

Therefore, it is possible to switch the state in which the wafers W are horizontally supported in a 2×2 matrix shape while being spaced apart from each other in the right-left direction and the state in which the wafers W are vertically supported in 2 stages each of which is provided with 2 sheets. By applying the vacuum transfer arm 5 to the vacuum processing apparatus, various layouts of the processing module 6 and the load-lock chambers 3A and 3B can be selected.

Therefore, even when the mounting tables 67A and 67B are arranged in a 2×2 matrix shape in the processing module 6 and the wafers W are supported in 2 sheets×2 stages in the load-lock chambers 3A and 3B, the vacuum transfer arm 5 can collectively transfer the wafers W to the mounting tables 67A and 67B and any one of the load-lock chambers 3A and 3B where the wafers W are held in a stacked manner. Accordingly, the throughput can be improved while suppressing the increase in the size of the apparatus.

Figure 21:
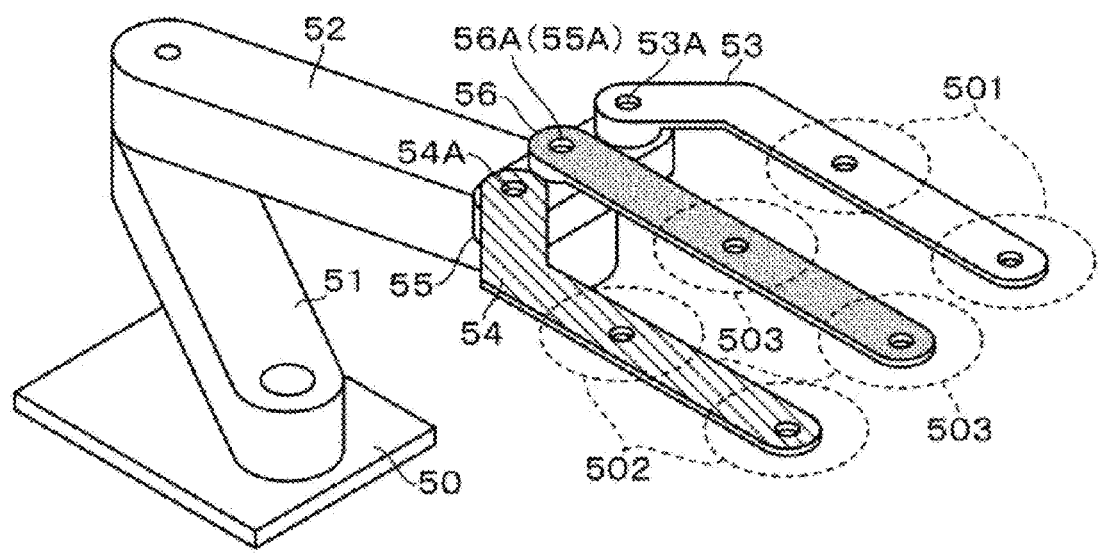
FIG. 21 is a perspective view showing a state in which wafers are supported horizontally in another example of the vacuum transfer arm.
Figure 22:
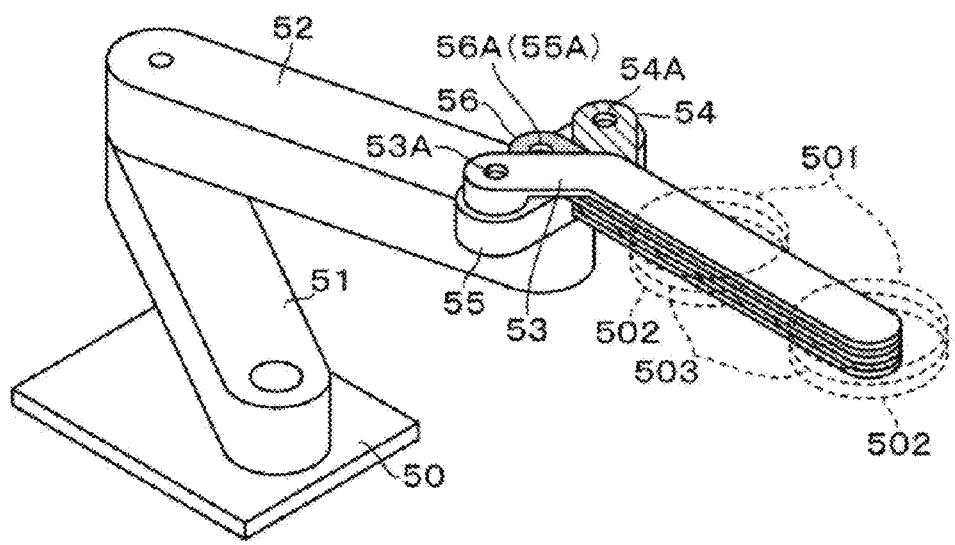
FIG. 22 is a perspective view showing a state in which wafers are supported in a stacked manner in another example of the vacuum transfer arm.

The vacuum transfer arm 5 may include three arms for supporting the wafers W. For example, as shown in FIGS. 21 and 22, a fourth rotary shaft 56A is disposed to overlap with the third rotary shaft 55A, and a third arm 56 having a tip portion extending forward from the fourth rotary shaft 56A is disposed at a height position between the first 53 and the second arm 54. A third substrate support region 503 for holding wafers W different from the wafers W held in the first substrate support region 501 and the second substrate support region 502 is disposed at the tip portion of the third arm 56. The third arm 56 extends forward regardless of the rotation angle of the rotating body 55. Therefore, the tip portion of the first arm 53, the tip portion of the second arm 54, and the third arm 56 are constantly in parallel with one another.

Figure 23A:
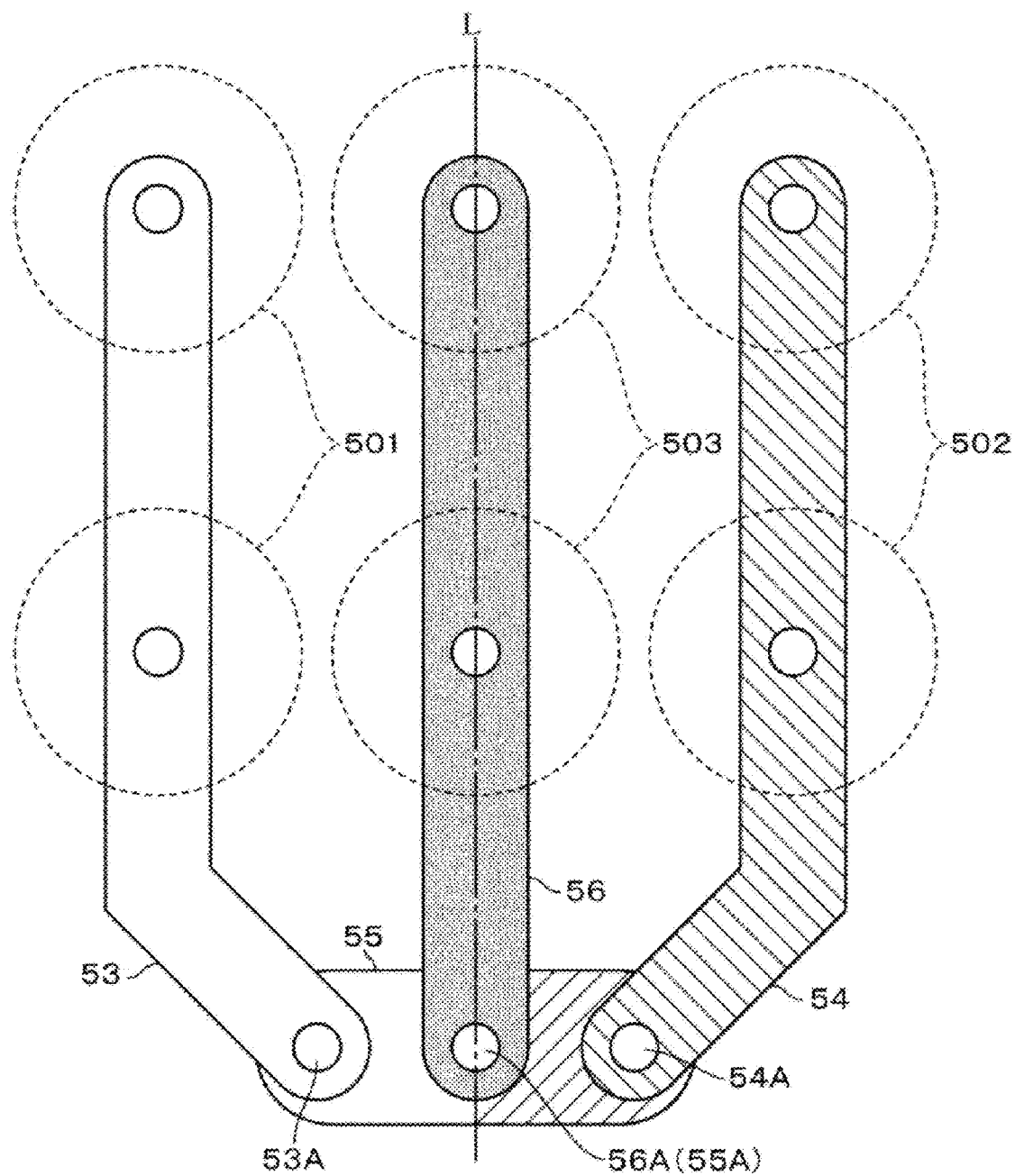
FIGS. 23A to 23D explain a rotation operation of the wafer holder.
Figure 23B:
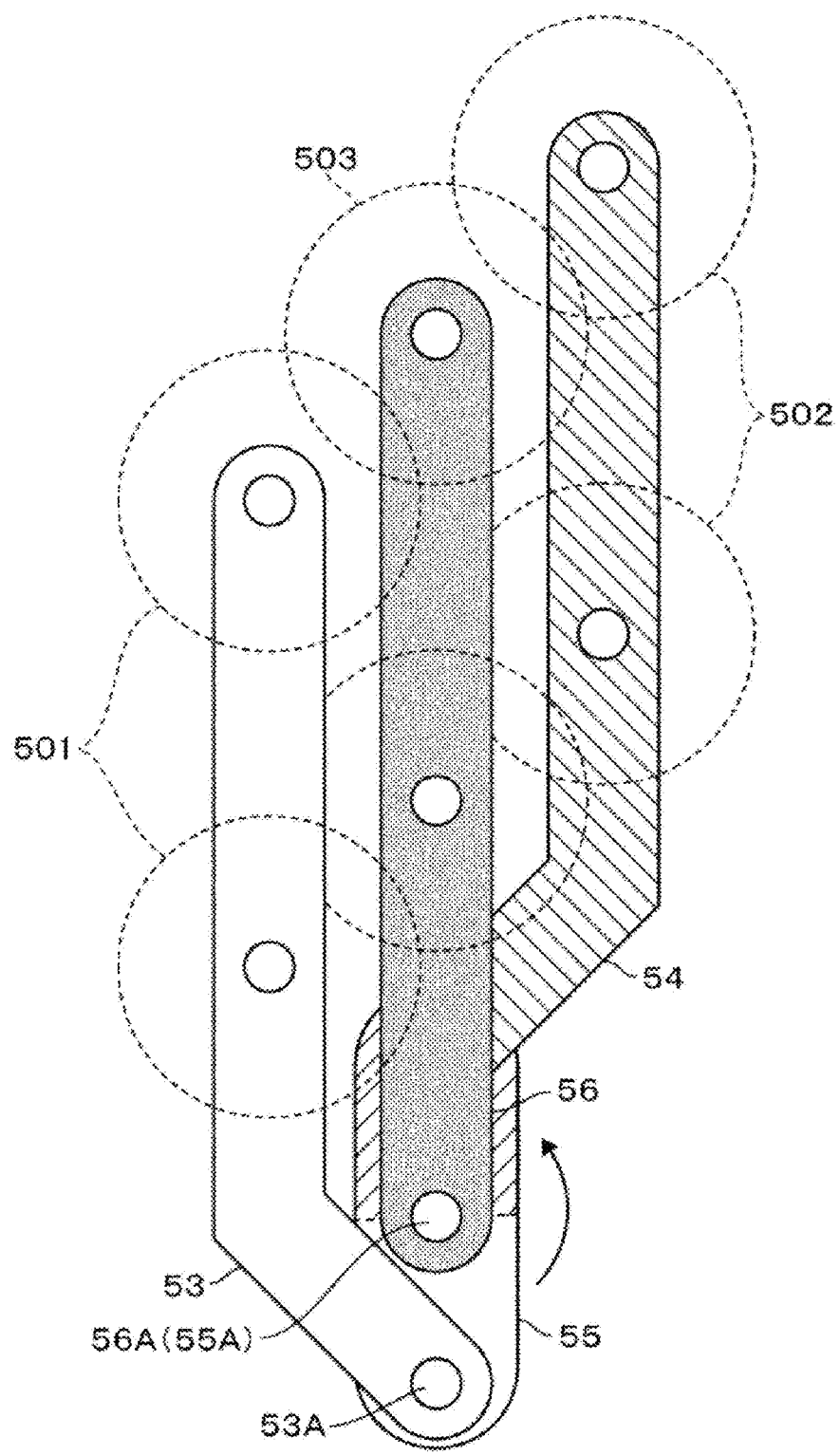
Figure 23C:
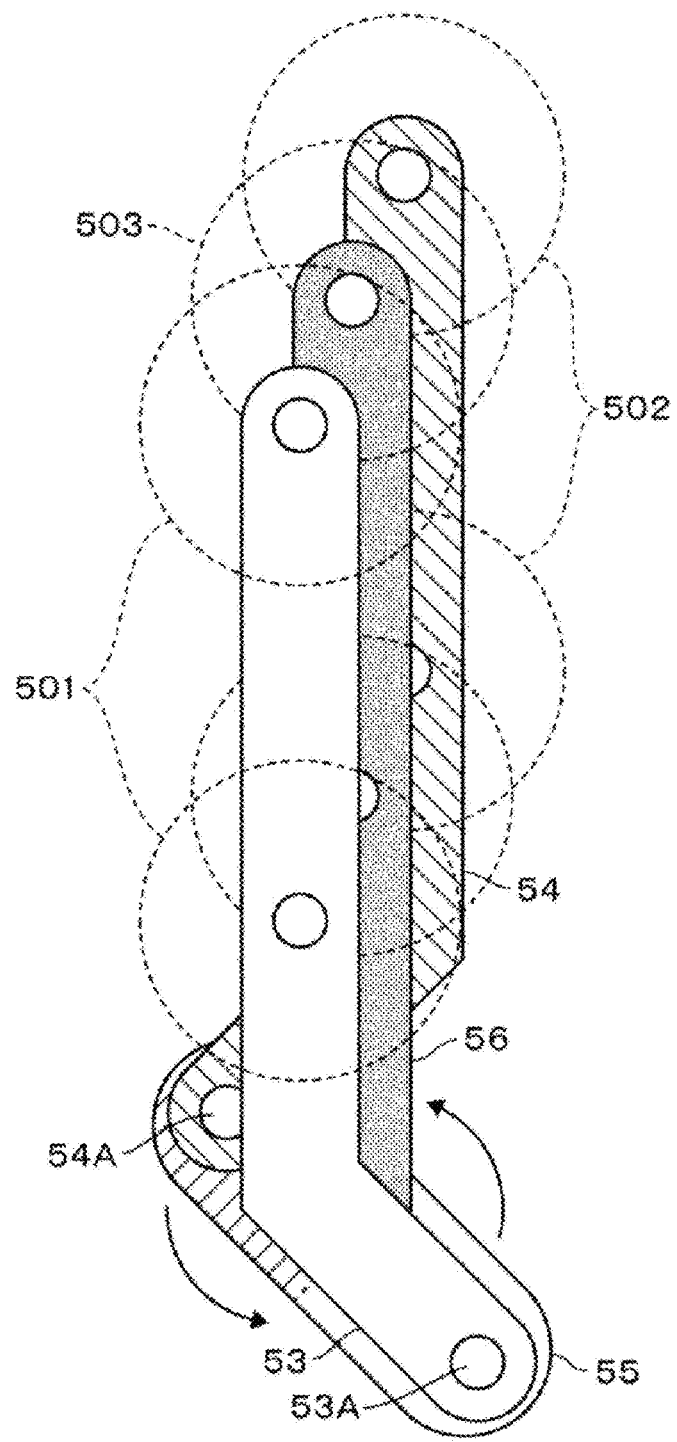
Figure 23D:
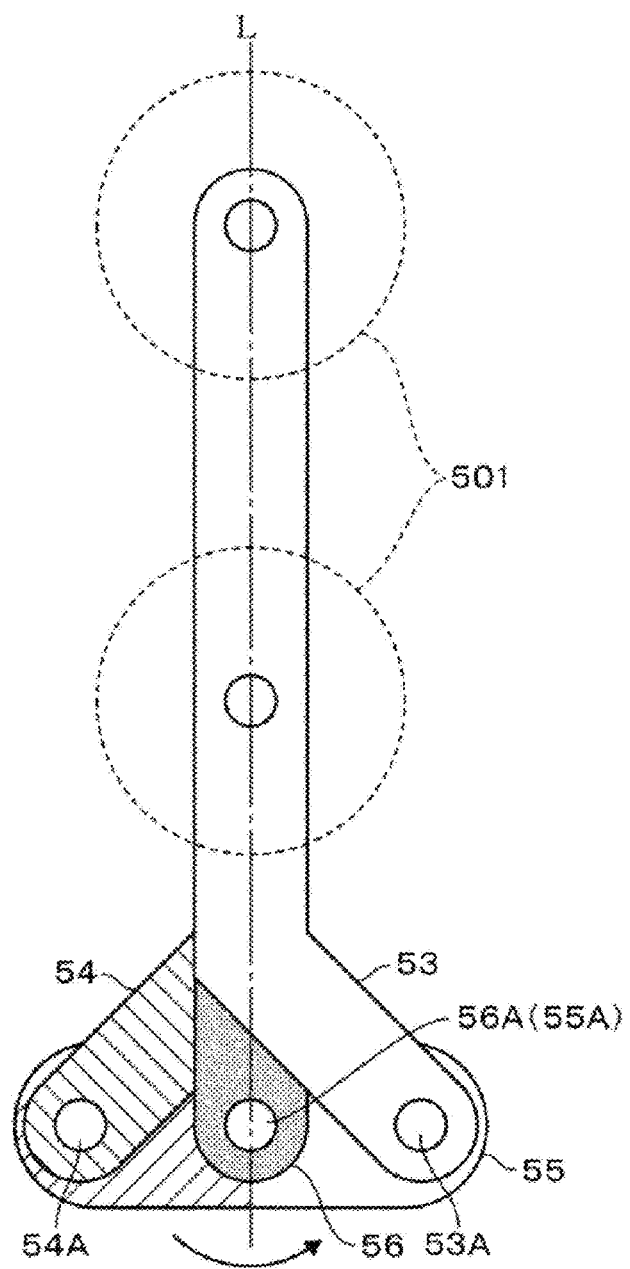

In the vacuum transfer arm 5 configured as described above, when the rotating body 55 is rotated by moving the first rotary shaft 53A to the left side and the second rotary shaft 54A to the right side, the first substrate support region 501, the second substrate support region 502, and the third substrate support region 503 become far from one another in the right-left direction, and six wafers W are supported horizontally, as shown in FIG. 23A. When the rotating body 55 is rotated in a counterclockwise direction when viewed from above from the state of FIG. 23A, the tip portion of the first arm 53, the tip portion of the second arm 54, and the third arm 56 become closer to one another while maintaining the parallel state therebetween as shown in FIGS. 23B and 23C. When the rotating body 55 is rotated by 180° in the counterclockwise direction when viewed from above from the state of FIG. 23A, the horizontal positions of the first support region 501, the second support region 502, and the third support region 503 are aligned and the wafers can be vertically stacked and supported in three stages as shown in FIG. 23D.

By using the vacuum transfer arm 5, the mounting tables 67A and 67B can be arranged in a 3×2 matrix shape in the processing module 6 when viewed from the transfer port side, and the load-lock chambers 3A and 3B can accommodate the wafers in three stages.

Figure 24A:
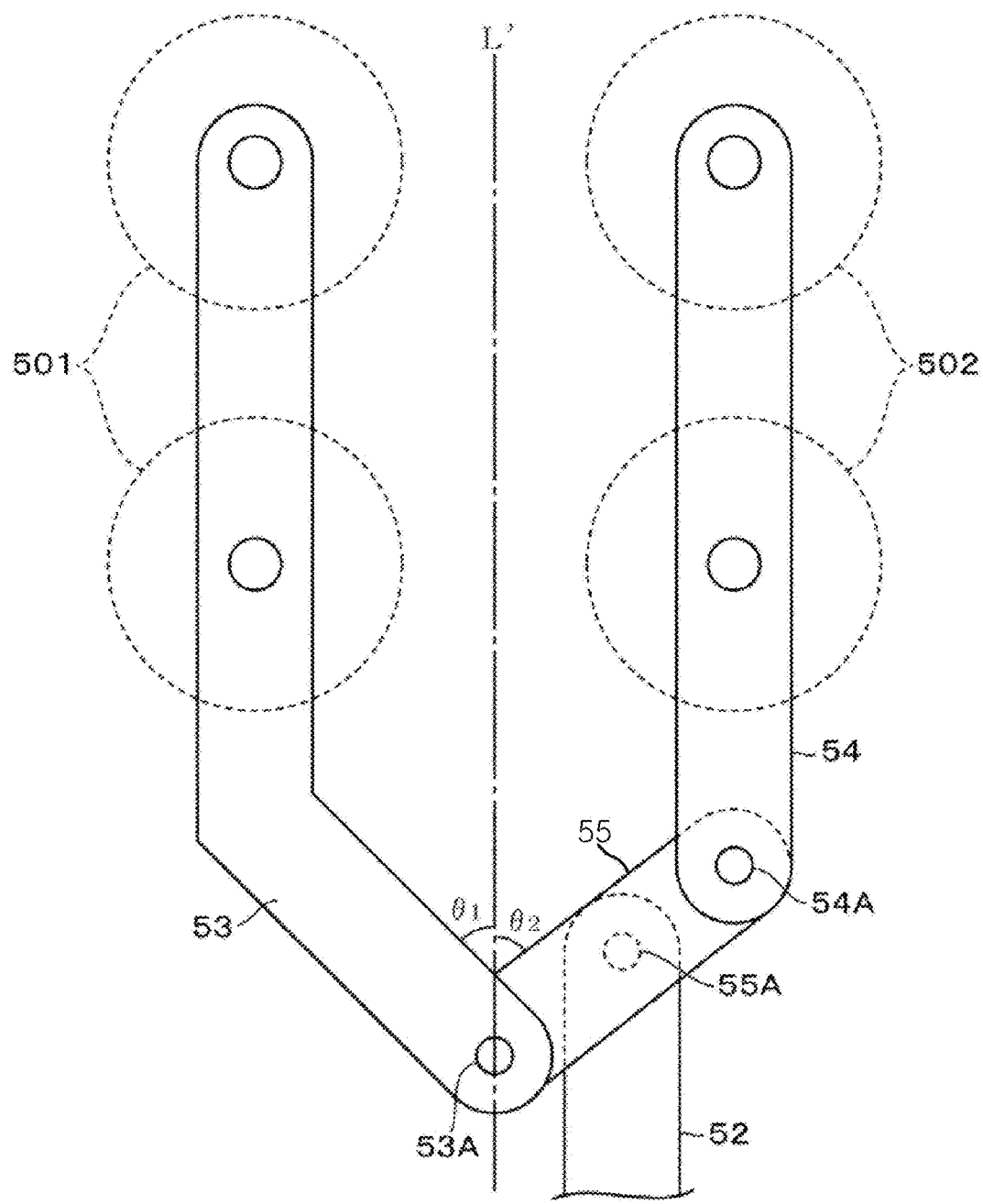
FIG. 24A is a plan view showing a state in which wafers are supported horizontally in still another example of the vacuum transfer arm.
Figure 24B:
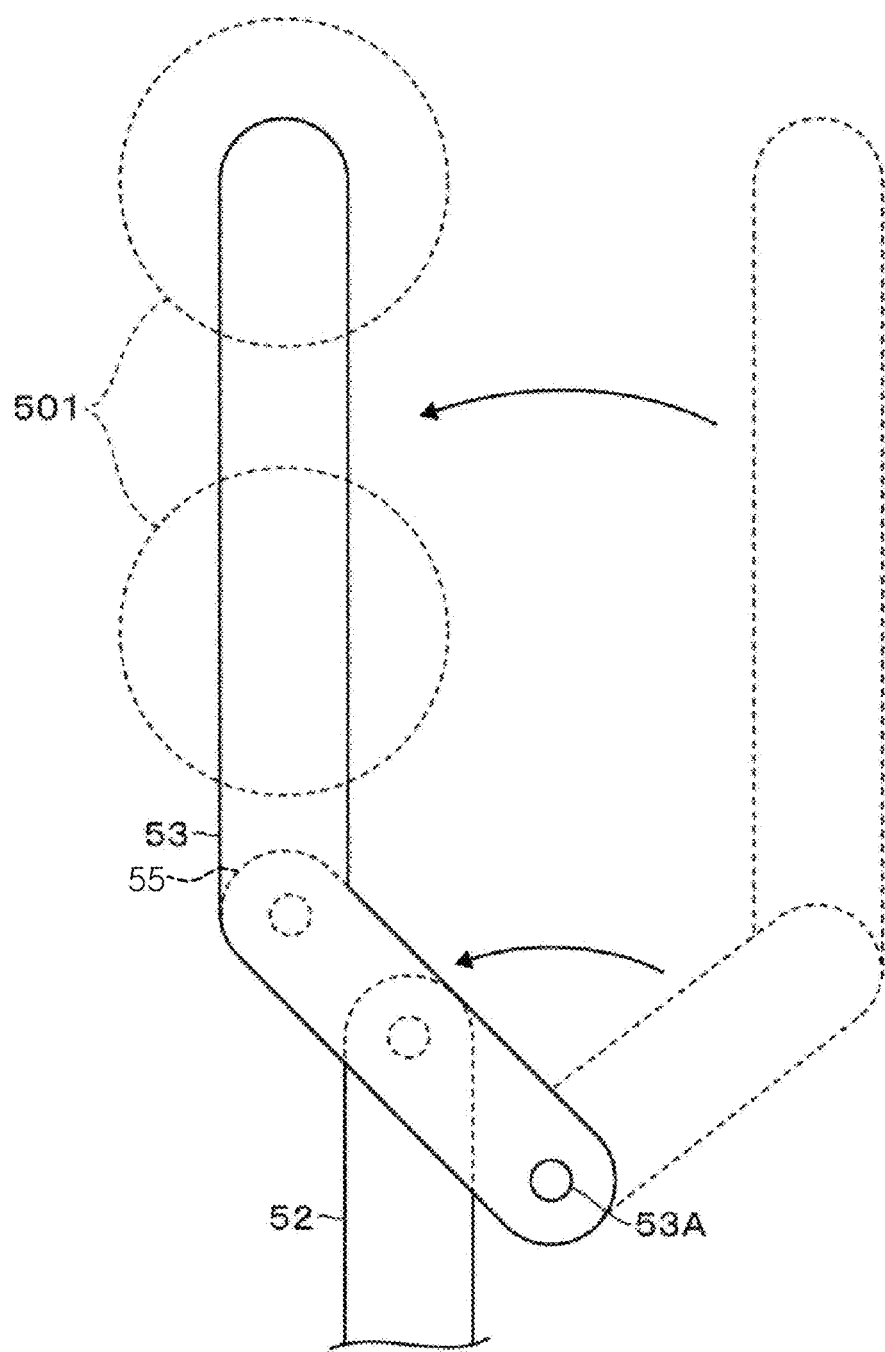
FIG. 24B is a plan view showing a state in which wafers are supported in a stacked manner in still another example of the vacuum transfer arm.

Still another example of the vacuum transfer arm 5 is shown in FIGS. 24A and 24B. The wafer holder 500 of the vacuum transfer arm 5 includes a first rotary shaft 53A and a second rotary shaft 54A extending in a vertical direction while being spaced apart from each other. Referring to FIG. 24A, a first arm 53 diagonally extends from the first rotary shaft 53A in a left-front direction, and the tip portion thereof is bent to extend forward. The distance from the first rotary shaft 53A to the forwardly bent portion of the first arm 53 is set to be the same as the distance between the first rotary shaft 53A and the second rotary shaft 54A. Further, a second arm 54 is configured to extend forward from the second rotary shaft 54A. The first arm 53 has a first substrate support region 501 for holding wafers, and the second arm 54 has a second substrate support region 502 for holding wafers.

In the vacuum transfer arm 5, as shown in FIG. 24A, by rotating the rotating body 55 such that an angle θ1 between an axis L' extending in the back-and-forth direction through the first rotary shaft 53A and a direction in which the base portion of the first arm 53 extends becomes the same as an angle θ2 between the axis L' and a direction in which the rotary body 55 extends, the first substrate support region 501 and the second substrate support region 502 can support the wafers W horizontally while being spaced apart from each other in the right-left direction.

By rotating the rotating body 55 in a counterclockwise direction from the state of FIG. 24A to be positioned below the first arm 53 as shown in FIG. 24B, the second arm 54 is moved to a position below the first arm 53. At this time, the first substrate support region 501 and the second substrate support region 502 are aligned, and the wafers W can be supported in a stacked manner Even with this configuration, the same effect can be obtained by rotating the rotating body 55 such that the wafer holder 500 of the vacuum transfer arm 5 can be switched between the state in which the wafers W are held horizontally and the state in which the wafers are held in a stacked manner.

In the second rotation operation of the support body, it is not necessary to set the first substrate support region and the second substrate support region to overlap vertically. When the second rotation operation is performed, switching may be performed between a state in which the distance in the right-left direction between the first substrate support region and the second substrate support region in parallel to each other is the first distance and a state in which the distance in the right-left direction between the first substrate support region and the second substrate support region in parallel to each other is the second distance that is shorter than the first distance.

The number of substrates supported by the first substrate support region, the second substrate support region, and the third substrate support region is not limited to two, and may be one or three or more. Further, the substrate transfer mechanism does not necessarily transfer the substrate between the load-lock chamber and the processing module. For example, it is also possible to connect a temporary storage unit for temporarily storing a plurality of substrates to the vacuum transfer chamber 9 and allow the substrate transfer mechanism to transfer the substrate between the temporary storage unit and the processing module.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate transfer mechanism comprising:
a moving body moving horizontally;
a support body supported by the moving body;
a first rotary shaft and a second rotary shaft provided at the support body while being spaced apart from each other and extended vertically;
a first arm extending forward from the first rotary shaft and including a tip portion forming a first substrate support region where one or more substrates are supported at an outer side of the support body;
a second arm extending forward from the second rotary shaft and including a tip portion forming a second substrate support region where one or more substrates different from the substrates supported by the first arm are supported at the outer side of the support body, the first arm and the second arm being disposed at different height positions;
a third rotary shaft vertically extended and configured to rotate the support body with respect to the moving body; and
a switching mechanism configured to switch a first rotation operation of rotating the support body such that a distance in a right-left direction between the first substrate support region and the second substrate support region is maintained and a second rotation operation of rotating the support body together with a rotation of at least one of the first rotary shaft and the second rotary shaft such that the distance in the right-left direction between the first substrate support region and the second substrate support region is changed between a first distance and a second distance shorter than the first distance.

2. The substrate transfer mechanism of claim 1, wherein the third rotary shaft is disposed between the first rotary shaft and the second rotary shaft in the right-left direction;
the switching mechanism rotates the first rotary shaft and the second rotary shaft in the second rotation operation;
the first arm further includes a base portion extending from the first rotary shaft to one side in the right-left direction, and the tip portion of the first arm continuously extends forward from the base portion;
the second arm further includes a base portion extending to the other side in the right-left direction, and the tip portion of the second arm continuously extends forward from the base portion.

3. The substrate transfer mechanism of claim 2, wherein when the distance in the right-left direction is the second distance, the first substrate support region and the second substrate support region overlap each other.

4. The substrate transfer mechanism of claim 2, wherein the first substrate support region supports the substrates in a longitudinal direction of the tip portion of the first arm and the second substrate support region supports the substrates in a longitudinal direction of the tip portion of the second arm.

5. The substrate transfer mechanism of claim 3, wherein the first substrate support region supports the substrates in a longitudinal direction of the tip portion of the first arm and the second substrate support region supports the substrates in a longitudinal direction of the tip portion of the second arm.

6. The substrate transfer mechanism of claim 2, further comprising:
a fourth rotary shaft extended vertically to overlap with the third rotary shaft; and
a third arm extending forward from the fourth rotary shaft and having a tip portion forming a third support region for supporting one or more substrates different from the substrates supported by the first arm and the second arm at the outer side of the support body,
wherein the third arm rotates such that a direction of the third arm when the distance in the right-left direction between the first substrate support region and the second substrate support region is the first distance is the same as a direction of the third arm when the distance in the right-left direction between the first substrate support region and the second substrate support region is the second distance.

7. The substrate transfer mechanism of claim 3, further comprising:
a fourth rotary shaft extended vertically to overlap with the third rotary shaft; and
a third arm extending forward from the fourth rotary shaft and having a tip portion forming a third support region for supporting one or more substrates different from the substrates supported by the first arm and the second arm at the outer side of the support body, wherein the third arm rotates such that a direction of the third arm when the distance in the right-left direction between the first substrate support region and the second substrate support region is the first distance is the same as a direction of the third arm when the distance in the right-left direction between the first substrate support region and the second substrate support region is the second distance.

8. The substrate transfer mechanism of claim 4, further comprising:

a fourth rotary shaft extended vertically to overlap with the third rotary shaft; and a third arm extending forward from the fourth rotary shaft and having a tip portion forming a third support region for supporting one or more substrates different from the substrates supported by the first arm and the second arm at the outer side of the support body, wherein the third arm rotates such that a direction of the third arm when the distance in the right-left direction between the first substrate support region and the second substrate support region is the first distance is the same as a direction of the third arm when the distance in the right-left direction between the first substrate support region and the second substrate support region is the second distance.

9. The substrate transfer mechanism of claim 5, further comprising:

a fourth rotary shaft extended vertically to overlap with the third rotary shaft; and a third arm extending forward from the fourth rotary shaft and having a tip portion forming a third support region for supporting one or more substrates different from the substrates supported by the first arm and the second arm at the outer side of the support body, wherein the third arm rotates such that a direction of the third arm when the distance in the right-left direction between the first substrate support region and the second substrate support region is the first distance is the same as a direction of the third arm when the distance in the right-left direction between the first substrate support region and the second substrate support region is the second distance.

10. The substrate transfer mechanism of claim 1, wherein the support body and the moving body form an articulated arm.

11. A substrate processing apparatus comprising:
a transfer chamber of a vacuum atmosphere;
a processing module connected to the transfer chamber and configured to process one or more substrates in a vacuum atmosphere;
a load-lock module connected to the transfer chamber; the substrate transfer mechanism described in claim 1, provided in the transfer chamber to transfer the substrates between the load-lock module and the processing module; and
a loader module on which a transfer container accommodating the substrates is mounted and configured to transfer the substrates between the transfer container and the load-lock module.

12. The substrate processing apparatus of claim 11, wherein the distance in the right-left direction is the first distance at least when the substrates are transferred to and from the processing module.

13. A substrate transfer method comprising:
moving a moving body horizontally;
rotating a first rotary shaft and a second rotary shaft provided at a support body supported by the moving body while being spaced apart from each other and extended vertically;
supporting a substrate on a first arm extending forward from the first rotary shaft and having a tip portion forming a first substrate support region at an outer side of the support body;
supporting a substrate different from the substrate supported on the first arm on a second arm extending forward from the second rotary shaft and having a tip portion forming a second substrate support region at the outer side of the support body, the first arm and the second arm being disposed at different height positions;
rotating the support body with respect to the moving body about a third rotary shaft vertically extended;
performing a first rotation operation of rotating the support body such that a distance in a right-left direction between the first substrate support region and the second substrate support region is maintained; and
performing a second rotation operation of rotating the support body together with a rotation of at least one of the first rotary shaft and the second rotary shaft such that the distance in the right-left direction between the first substrate support region and the second substrate support region is changed between a first distance and a second distance shorter than the first distance.

* * * * *